United States Patent
Chen et al.

(10) Patent No.: US 12,464,750 B2
(45) Date of Patent: Nov. 4, 2025

(54) SEMICONDUCTOR DEVICE AND FORMATION METHOD THEREOF

(71) Applicant: TAIWAN SEMICONDUCTOR MANUFACTURING COMPANY, LTD., Hsinchu (TW)

(72) Inventors: Guan-Lin Chen, Hsinchu County (TW); Kuo-Cheng Chiang, Hsinchu County (TW); Shi Ning Ju, Hsinchu (TW); Jung-Chien Cheng, Tainan (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 616 days.

(21) Appl. No.: 17/886,753

(22) Filed: Aug. 12, 2022

(65) Prior Publication Data

US 2024/0055502 A1 Feb. 15, 2024

(51) Int. Cl.

| | |
|---|---|
| *H01L 29/66* | (2006.01) |
| *H01L 21/02* | (2006.01) |
| *H01L 21/762* | (2006.01) |
| *H01L 29/06* | (2006.01) |
| *H01L 29/08* | (2006.01) |
| *H01L 29/423* | (2006.01) |
| *H01L 29/775* | (2006.01) |
| *H01L 29/786* | (2006.01) |
| *H10D 30/01* | (2025.01) |

(Continued)

(52) U.S. Cl.
CPC ..... *H10D 30/014* (2025.01); *H01L 21/02603* (2013.01); *H01L 21/76224* (2013.01); *H10D 30/031* (2025.01); *H10D 30/43* (2025.01); *H10D 30/6735* (2025.01); *H10D 30/6757* (2025.01); *H10D 62/121* (2025.01); *H10D 62/151* (2025.01)

(58) Field of Classification Search
CPC .. H10D 30/014; H10D 30/024; H10D 30/031; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 84/013; H10D 84/0158; H10D 84/017; H10D 84/0193; H10D 84/834; H10D 84/853; H01L 21/02603; H01L 21/76224
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — David C Spalla
(74) *Attorney, Agent, or Firm* — Birch, Stewart, Kolasch & Birch, LLP

(57) ABSTRACT

A method of forming a semiconductor device includes etching trenches in a substrate to form semiconductor fins, filling a first one of the trenches with a dielectric fin, forming an insulation material in a second one of the trenches, performing a first recessing process to recess the insulation material and form a gap on a top of the dielectric fin, filling the gap with a dielectric cap, and forming a gate stack across the semiconductor fins and the dielectric fin.

20 Claims, 29 Drawing Sheets

Fig. 25C

(51) Int. Cl.
    *H10D 30/43*         (2025.01)
    *H10D 30/67*         (2025.01)
    *H10D 62/10*         (2025.01)
    *H10D 62/13*         (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0343377 A1* | 10/2020 | Chiang ................. H10D 30/62 |
| 2021/0082966 A1* | 3/2021 | Lin ...................... H10D 86/215 |
| 2021/0098304 A1* | 4/2021 | Chang .................. H10D 30/014 |
| 2021/0159311 A1* | 5/2021 | Lan ..................... H10D 84/0158 |
| 2022/0059534 A1* | 2/2022 | Choi .................... H10D 30/6211 |
| 2024/0006494 A1* | 1/2024 | Haratipour ......... H10D 30/6219 |
| 2024/0154037 A1* | 5/2024 | Guler .................. H10D 84/013 |

\* cited by examiner

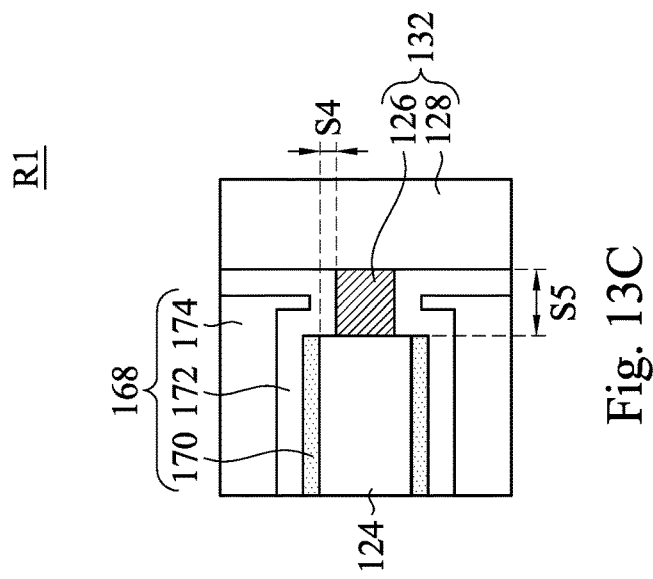
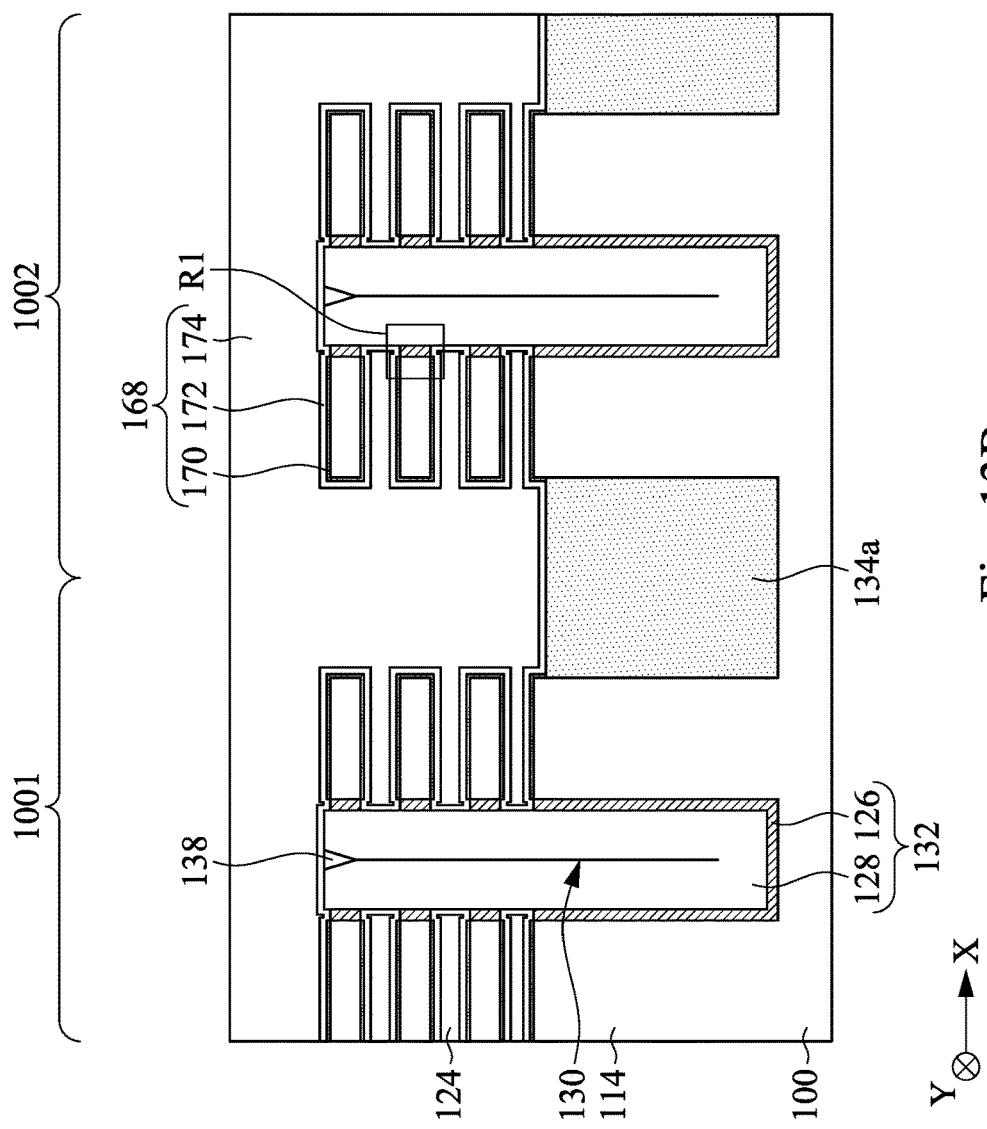
Fig. 13C
Fig. 13B

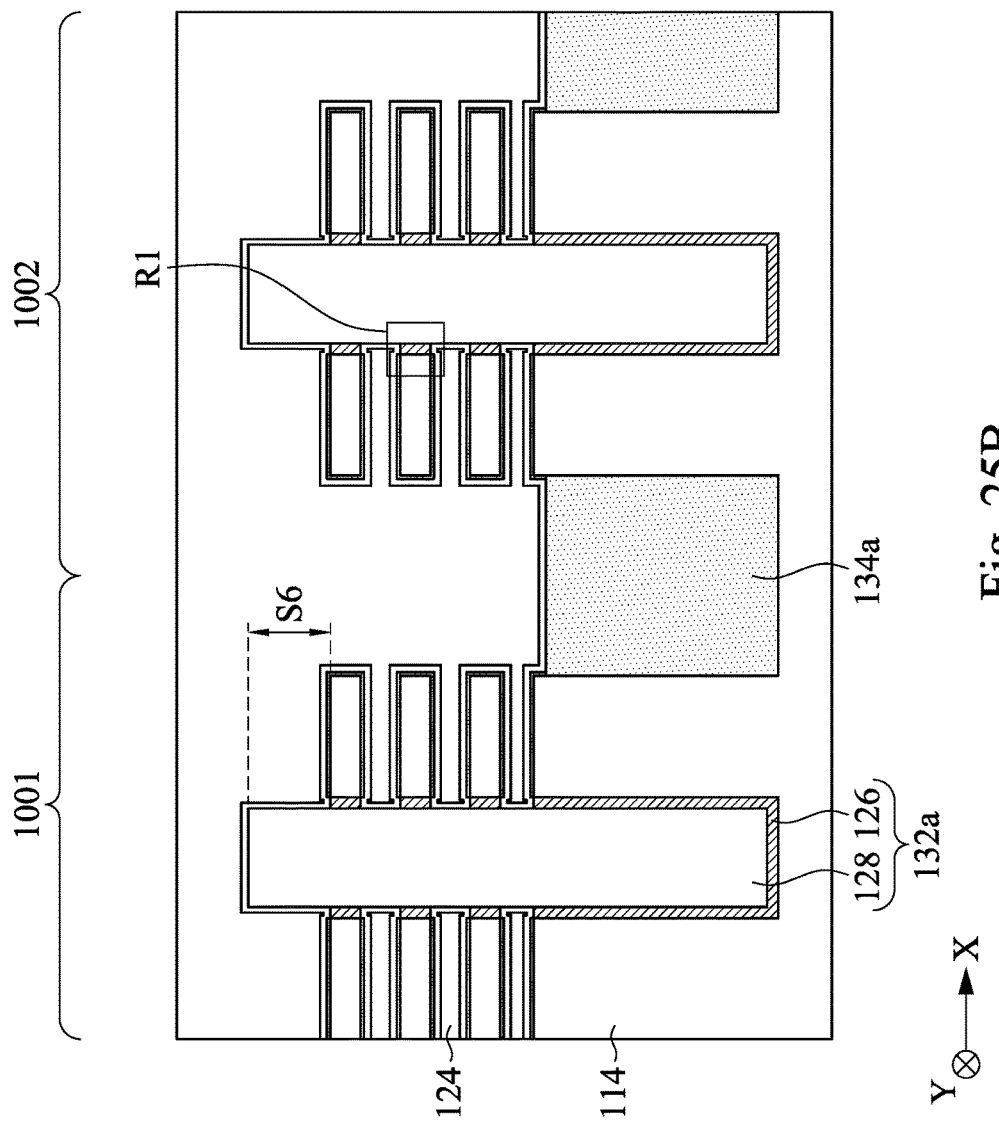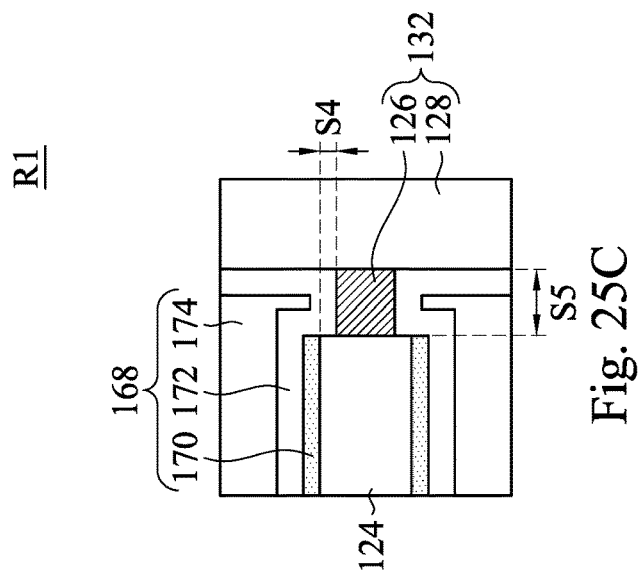
Fig. 25B
Fig. 25C

SEMICONDUCTOR DEVICE AND FORMATION METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13B is a cross-sectional view corresponding to line X1-X1 of FIG. 13A according to some embodiments of the present disclosure.

FIG. 13C is an enlarged view of a region in FIG. 13B.

FIG. 25B is a cross-sectional view corresponding to line X4-X4 of FIG. 25A according to some embodiments of the present disclosure.

FIG. 25C is an enlarged view of a region in FIG. 25B.

DETAILED DESCRIPTION

Figure 1:
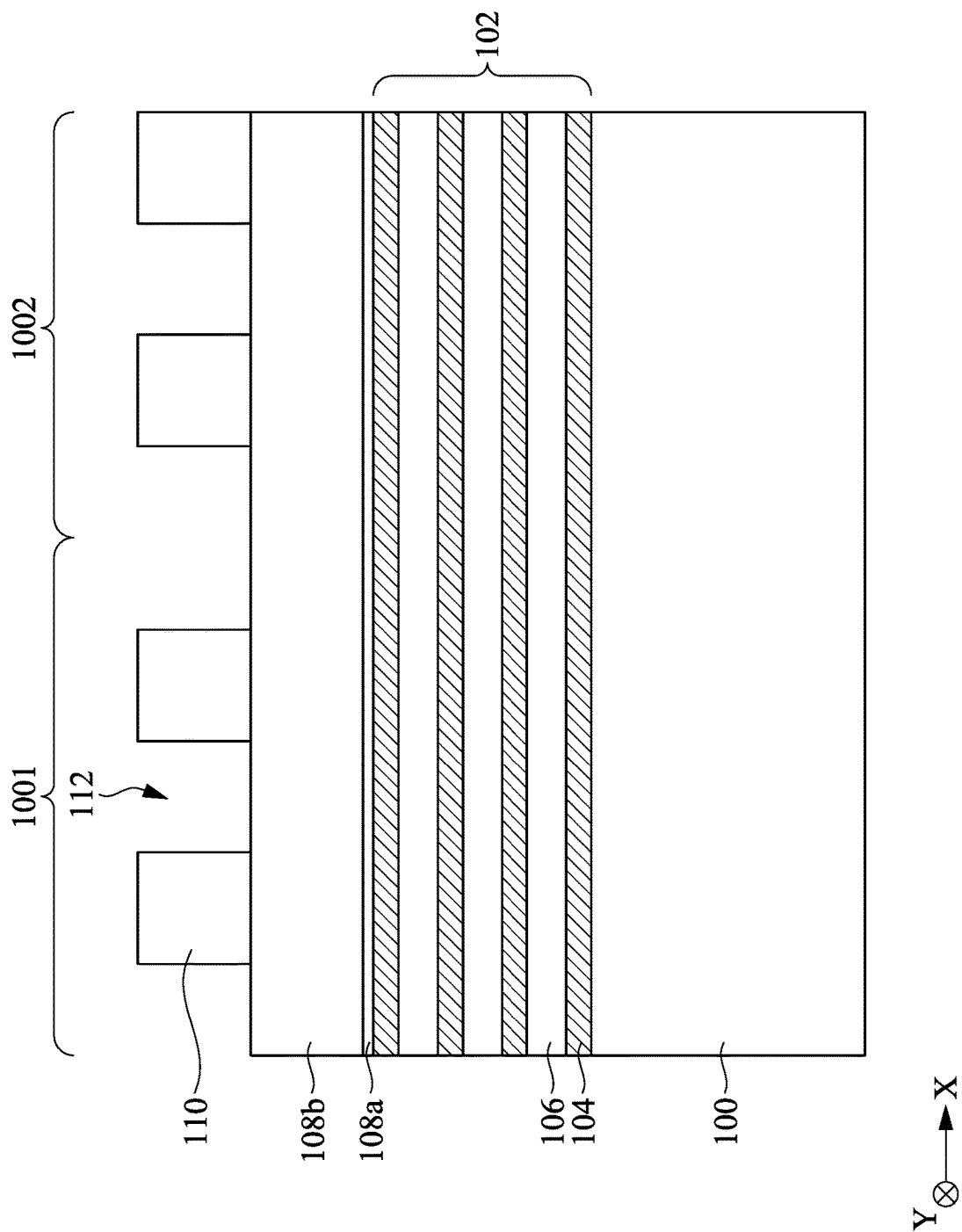
FIGS. 1-8 are cross-sectional views of a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit (IC) structures and methods of forming the same, and more particularly to fabricating gate-all-around (GAA) transistors having fish-bone structures or fork-sheet structures. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as fin field effect transistors (FinFET), on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

The present disclosure provides a GAA transistor including fork-sheet structure to reduce a lateral sheet-to-sheet distance and improve gate-to-drain capacitance by reducing endcap portions of metal gate. With the increasing downscaling of integrated circuit, in fork-sheet structures, a width of a dielectric fin between nanosheets is continuously shrinking. Accordingly, an aspect ratio of the dielectric fin continuously increases. High aspect ratio may result in seam formation in the dielectric fin and bridging risk of source/drain epitaxial structures, which in turn results in unexpected device failure.

One aspects of embodiments of the present disclosure provide forming a dielectric cap within a top gap of the seam and reducing a height of the dielectric fin to prevent shorting between source/drain contact and the metal gate. Another aspect of embodiments of the present disclosure provide increasing a height of the dielectric fin to prevent bridging risk between source/drain epitaxial structures.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

Figure 13A:
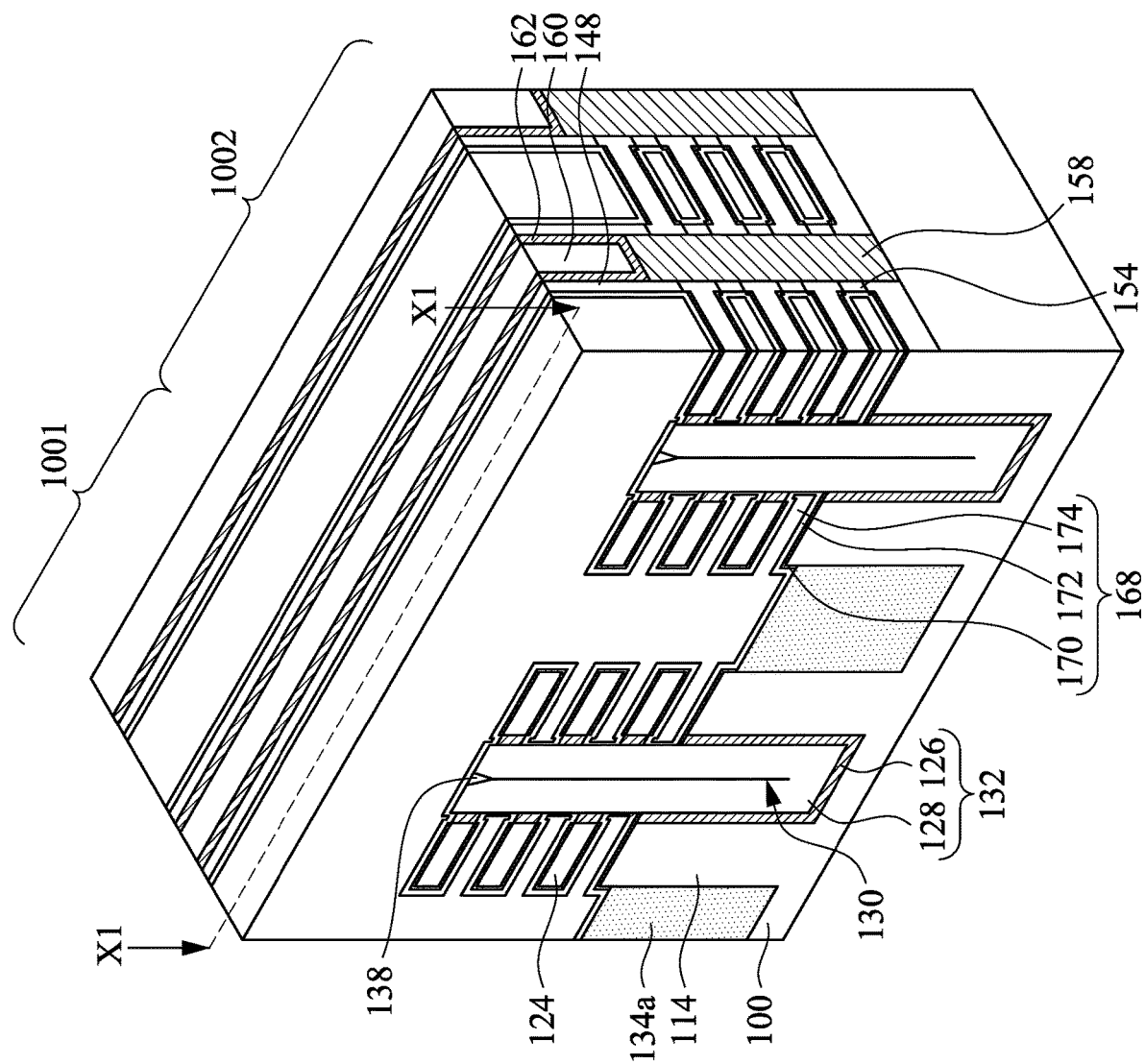
Figure 14A:
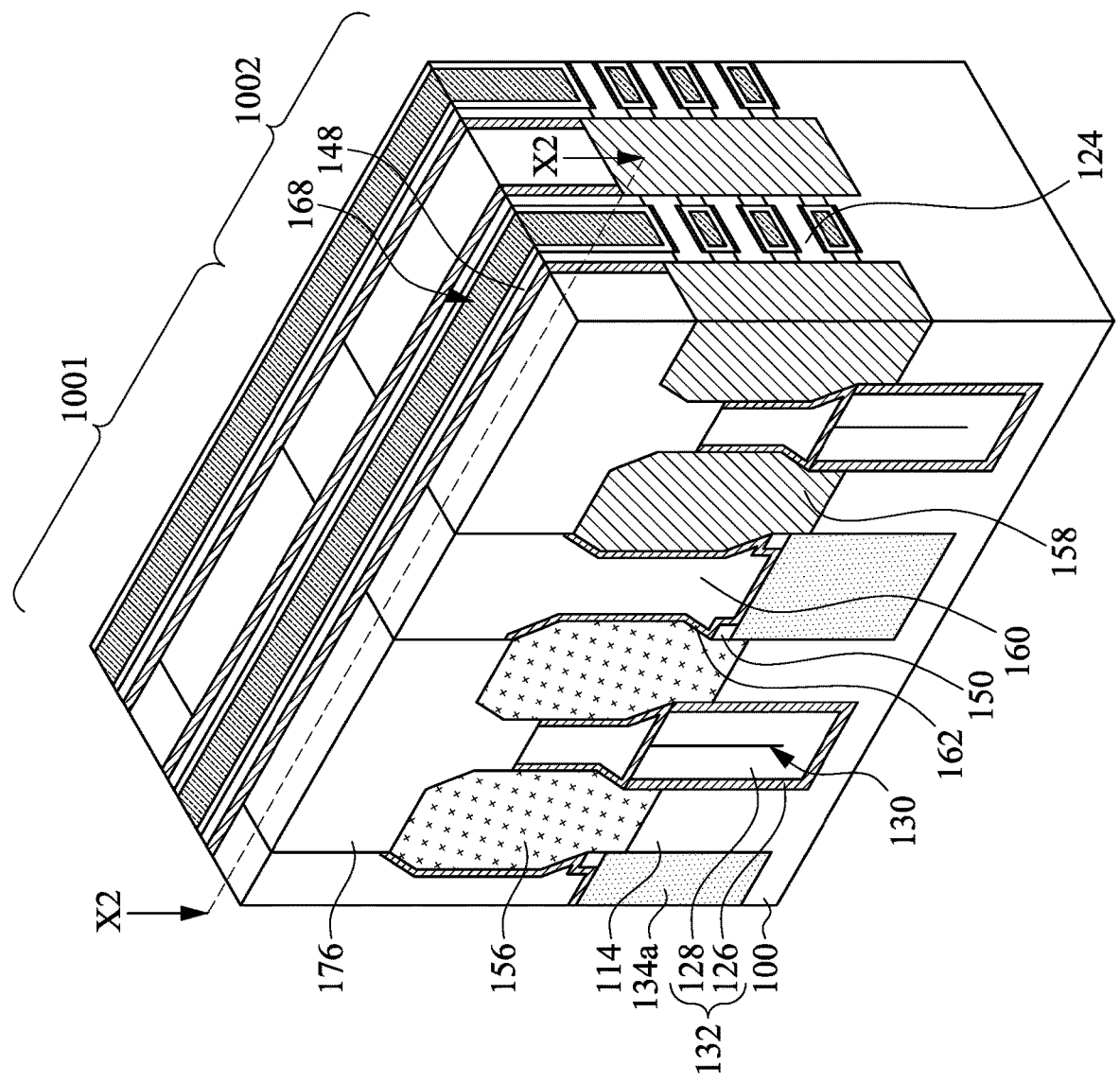
FIG. 14A is a perspective view of a method of manufacturing a semiconductor device at various stages in accordance with some embodiments.
Figure 14B:
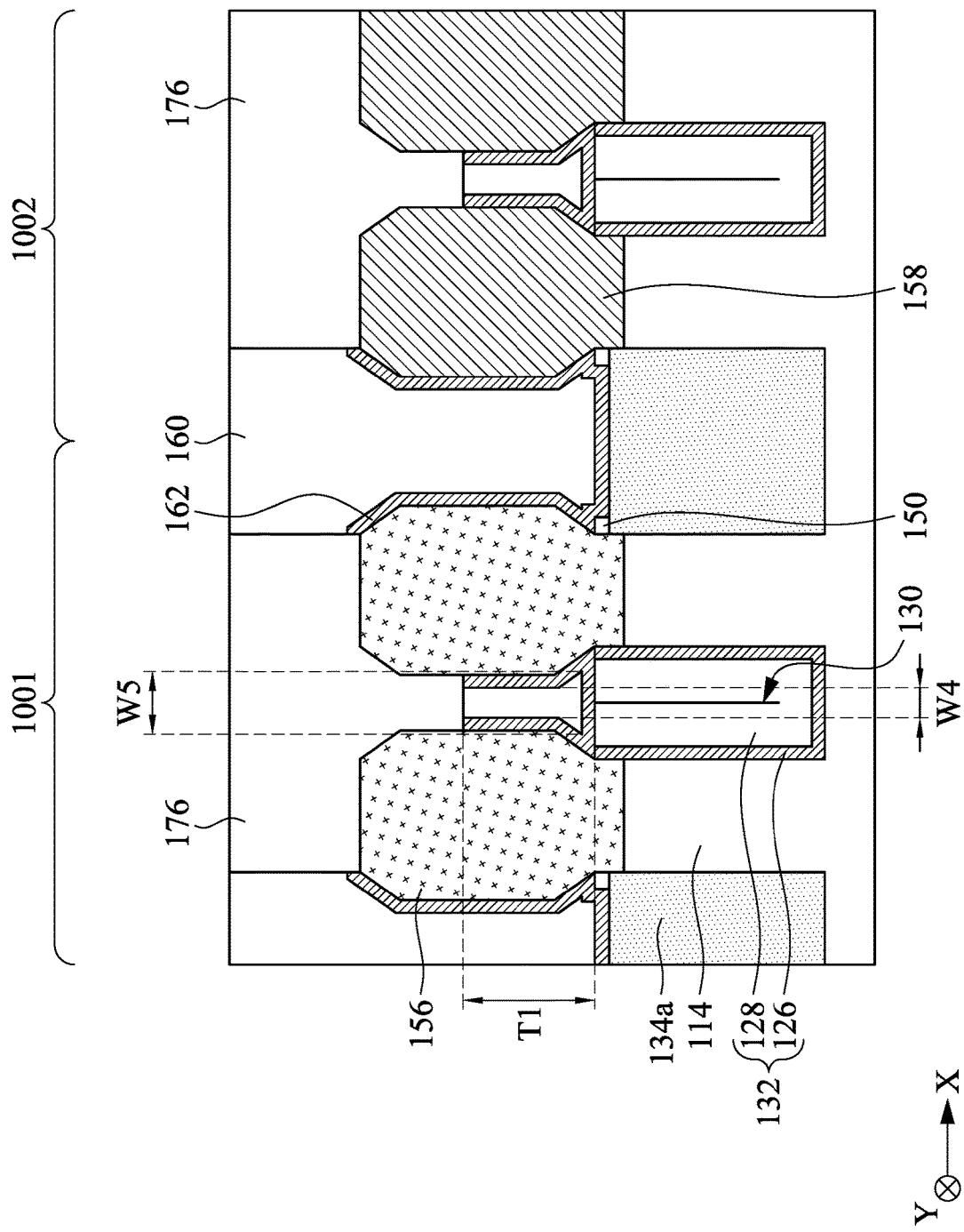
FIG. 14B is a cross-sectional view corresponding to line X2-X2 of FIG. 14A according to some embodiments of the present disclosure.

FIGS. 1-8 are cross-sectional views of a method of manufacturing a semiconductor device at various stages in accordance with some embodiments. FIGS. 9, 10, 11, 12, 13A are perspective views of a method of manufacturing a semiconductor device at various stages in accordance with some embodiments. FIG. 13B is a cross-sectional view corresponding to line X1-X1 of FIG. 13A according to some embodiments of the present disclosure. FIG. 13C is an enlarged view of a region in FIG. 13B. FIG. 14A is a perspective view of a method of manufacturing a semiconductor device at various stages in accordance with some embodiments. FIG. 14B is a cross-sectional view corresponding to line X2-X2 of FIG. 14A according to some embodiments of the present disclosure. For the ease and accuracy of orientation referral, an x-y-z coordinate reference is provided, in which the x-axis is generally orientated along a substrate surface in a first direction, the y-axis is generally oriented along the substrate surface perpendicular to the x-axis, while the z-axis is oriented generally along the vertical direction with respect to the planar surface of a substrate (which, in most cases, defined by the x-y plane).

In FIG. 1, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has a first device region 1001 and a second de region 1002. The first device region 1001 is a region in which first transistors will reside, and the second device region 1002 is a region in which second transistors will reside. In some embodiments, the first transistors are different from the second transistors at least in threshold voltage. For example, first transistors in the first device region 1001 may be High Voltage (HV) devices (e.g., I/O devices), and second transistors in the second device region 1002 may be Low Voltage (LV) devices (e.g., logic devices). In some other embodiments, the first transistors are different from the second transistors at least in conductivity type. For example, the first device region 1001 can be for forming n-type devices, such as n-channel metal-oxide-semiconductor (NMOS) transistors, e.g., n-type GAA-FETs, and the second device region 1002 can be for forming p-type devices, such as p-channel metal-oxide-semiconductor (PMOS) transistors, e.g., p-type GAA-FETs.

The first device region 1001 may be separated from the second device region 1002, and any number of device features (e.g., other active devices, doped regions, isolation structures, etc.) may be disposed between the first device region 1001 and the second device region 1002. Although one first device region 1001 and one second device region 1002 are illustrated, any number of first device regions 1001 and second device regions 1002 may be provided.

Further in FIG. 1, a multi-layer stack 102 is formed over the substrate 100. The multi-layer stack 102 includes alternating layers of first semiconductor layers 104 and second semiconductor layers 106. For purposes of illustration and as discussed in greater detail below, the first semiconductor layers 104 will be removed and the second semiconductor layers 106 will be patterned to form channel regions of GAA-FETs.

The first semiconductor layers 104, and the second semiconductor layers 106 may include one or more layers of Si, Ge, SiGe, GaAs, InSb, GaP, GaSb, InAlAs, InGaAs, GaSbP, GaAsSb or InP. In some embodiments, the first semiconductor layers 104 and the second semiconductor layers 106 are made of Si, a Si compound, SiGe, Ge or a Ge compound. The first semiconductor layers 104 include a first composition and the second semiconductor layers 106 include a second composition different from the first composition. The first and second compositions have different oxidation rates and/or etch selectivity. For example, the first semiconductor layers 104 may include SiGe and the second semiconductor layers 106 may include Si.

The multi-layer stack 102 is illustrated as including four layers of the first semiconductor layers 104 and three layers of the second semiconductor layers 106 for illustrative purposes. In some embodiments, the multi-layer stack 102 may include any number of the first semiconductor layers 104 and the second semiconductor layers 106. Each of the layers of the multi-layer stack 102 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 106 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 104 of the first semiconductor material may be removed without significantly removing the second semiconductor layers 106 of the second semiconductor material, thereby allowing the second semiconductor layers 106 to serve as channel regions of GAA-FETs.

A Pad layer 108a and a mask layer 108b may be formed on the multi-layer stack 102. The pad layer 108a may be a thin film comprising silicon oxide formed, for example, using a thermal oxidation process. The pad layer 108a may act as an adhesion layer between multi-layer stack 102 and the mask layer 108b. The pad layer 108a may also act as an etch stop layer for etching the mask layer 108b. In an embodiment, the mask layer 108b is formed of silicon nitride, for example, using low-pressure chemical vapor deposition (LPCVD). In other embodiments, the mask layer 108b is formed by thermal nitridation of silicon, plasma enhanced chemical vapor deposition (PECVD), or plasma anodic nitridation. The mask layer 108b is used as a hard mask during subsequent photolithography processes. A photo resist 110 is formed on the mask layer 108b and is then patterned, forming openings 112 in the photo resist 110.

Figure 2:
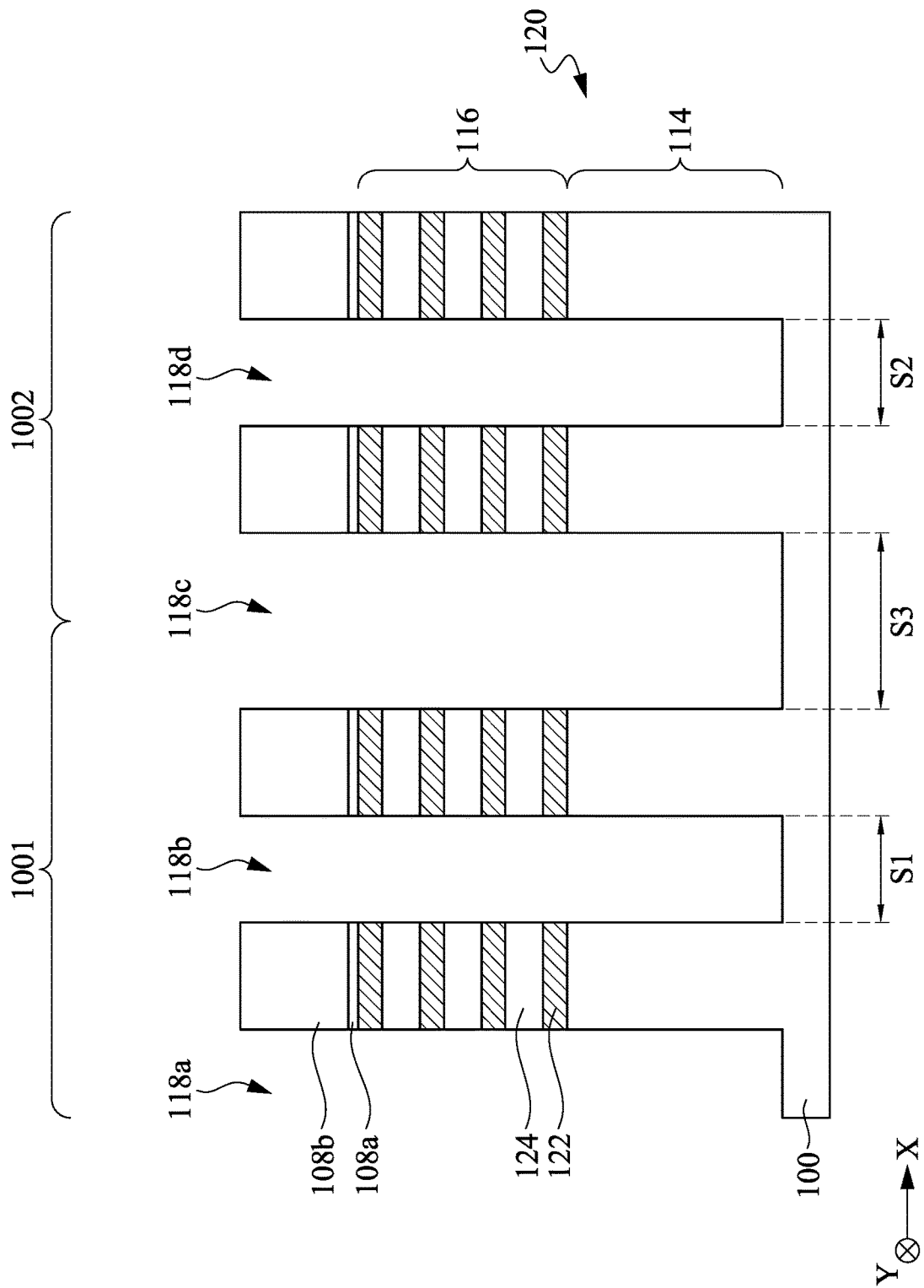

The mask layer 108b and the pad layer 108a are etched through the openings 112 to expose the underlying multi-layer stack 102. The photo resist 110 is removed. The exposed multi-layer stack 102 and the underlying substrate 100 are then etched to form trenches 118a, 118b, 118c, 118d in the multi-layer stack 102 and the substrate 100 using the mask layer 108b and the pad layer 108a as an etch mask. Fin structures 114 are formed in the substrate 100 and nanostructures 116 are formed in the multi-layer stack 102, in accordance with some embodiments, as shown in FIG. 2. Each fin structure 114 and overlying nanostructures 116 can be collectively referred to as a fin 120 extending from the substrate 100. The trenches 118a-118d separate neighboring nanostructures 116 and neighboring fin structures 114. The etching may be any acceptable etch process, such as a reactive ion etch (RIE), neutral beam etch (NBE), the like, or a combination thereof. The etching may be anisotropic. Forming the nanostructures 116 by etching the multi-layer stack 102 may further define first nanostructures 122 from the first semiconductor layers 104 and define second nanostructures 124 from the second semiconductor layers 106. The first nanostructures 122 and the second nanostructures 124 may further be collectively referred to as nanostructures 116.

The fin structures 114 and the nanostructures 116 may be patterned by any suitable method. For example, the fin structures 114 and the nanostructures 116 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 114 and the nanostructures 116.

FIG. 2 illustrates the fin structures 114 in the first device region 1001 and the second device region 1002 as having substantially equal widths for illustrative purposes. In some embodiments, widths of the fin structures 114 in the first device region 1001 may be greater or thinner than the fin structures 114 in the second device region 1002. Further, while each of the fin structures 114 and the nanostructures 116 are illustrated as having a consistent width throughout, in other embodiments, the fin structures 114 and/or the nanostructures 116 may have tapered sidewalls such that a width of each of the fin structures 114 and/or the nanostructures 116 continuously increases in a direction towards the substrate 100. In such embodiments, each of the nanostructures 116 may have a different width and be trapezoidal in shape.

The process described above with respect to FIGS. 1 and 2 is just one example of how the fin structures 114 and the nanostructures 116 may be formed. In some embodiments, the fin structures 114 and/or the nanostructures 116 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 114 and/or the nanostructures 116. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers (and resulting nanostructures 122) and the second semiconductor layers (and resulting nanostructures 124) are illustrated and discussed herein as comprising the same materials in the second device region 1002 and the first device region 1001 for illustrative purposes only. As such, in some embodiments one or both of the first semiconductor layers and the second semiconductor layers may be different materials or formed in a different order in the first and second device regions 1001 and 1002.

In some embodiments, the two neighboring fins 120 in the first device region 1001 have a first spacing S1, the two neighboring fins 120 in the second device region 1002 have a second spacing S2, and the two neighboring fins 120 in different device regions (e.g., the first device region 1001 and the second device region 1002) have a third spacing S3. The third spacing S3 is greater than the first spacing S1 and the second spacing S2. In other words, the trench 118c is wider than the trenches 118b and 118d.

Figure 3:
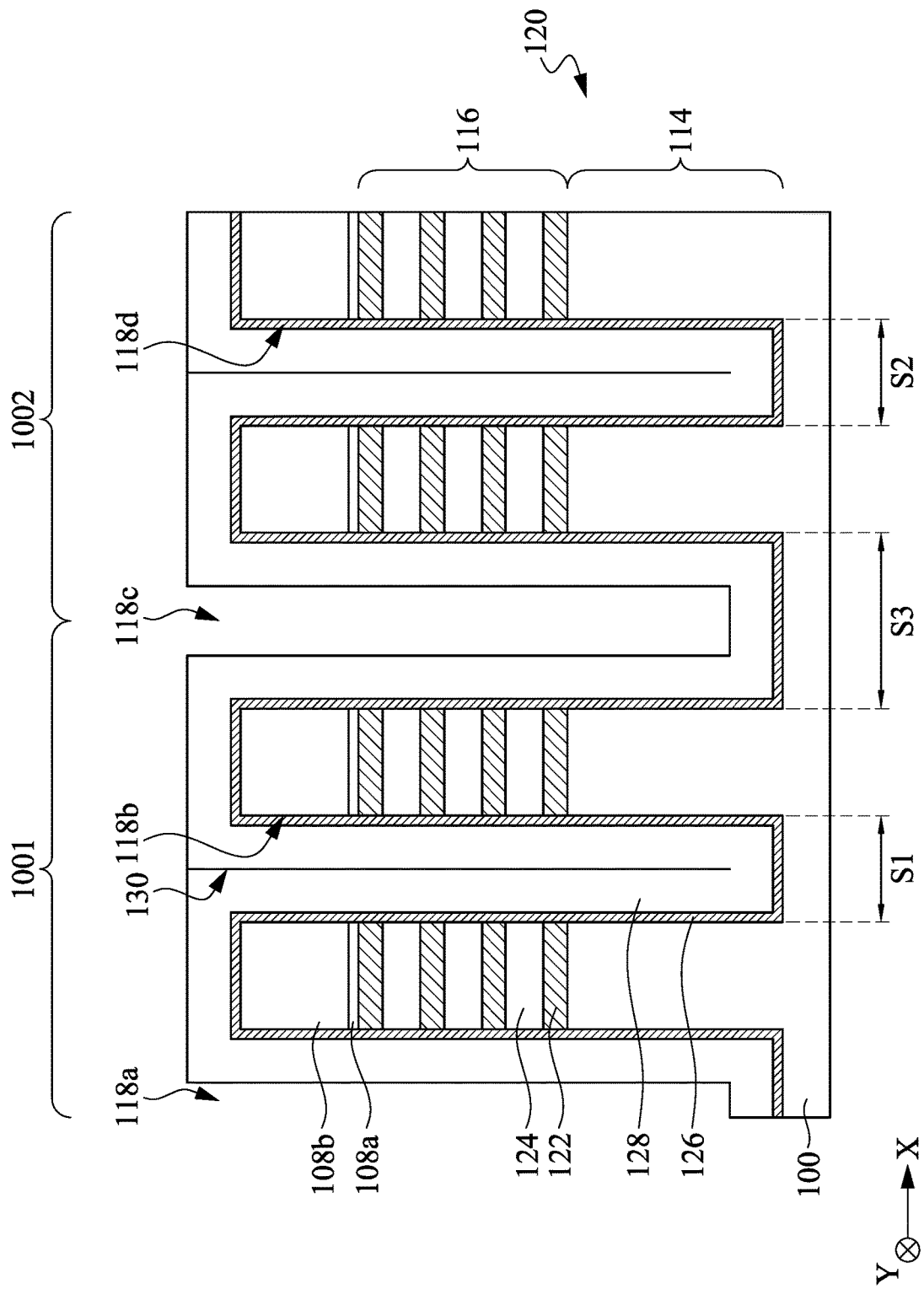

Referring to FIG. 3, a first dielectric film 126 and a second dielectric film 128 are formed in sequence on the fins 120, the pad layer 108a and the mask layer 108b. For example, the first dielectric film 126 is conformally deposited on the structure in FIG. 2 using CVD, ALD, or a suitable method. The first dielectric film 126 lines sidewalls and bottom surface of the trenches 118a-118d. The second dielectric film 128 is then conformally deposited on the first dielectric film 126 using CVD, ALD, or a suitable method. The first dielectric film 126 and the second dielectric film 128 include different low-k dielectric materials. For example, the first dielectric film 126 has different etch selectivity than the second dielectric film 128. In some embodiments, the first dielectric film 126 includes SiN, SiCN or the like, and the second dielectric film 128 includes SiOC, SiOCN or the like.

Due to width differences among the trenches 118a-118d, the second dielectric film 128 completely fills the trench 118b, which is narrower than the trench 118c, but does not completely fill the trench 118c. In the example where the formation of the second dielectric film 128 is a conformal process, a seam 130 is formed within the second dielectric film 128 by virtue of the conformal process and high aspect ratio of the trench 118b. For example, the second dielectric film 128 can have lateral growth fronts in the trench 118b (e.g., proceeding laterally from sidewalls of respective fins 120) that merge together. The merging of the lateral growth fronts can create the seam 130 in the second dielectric film 128 between neighboring fins 120.

Figure 4:
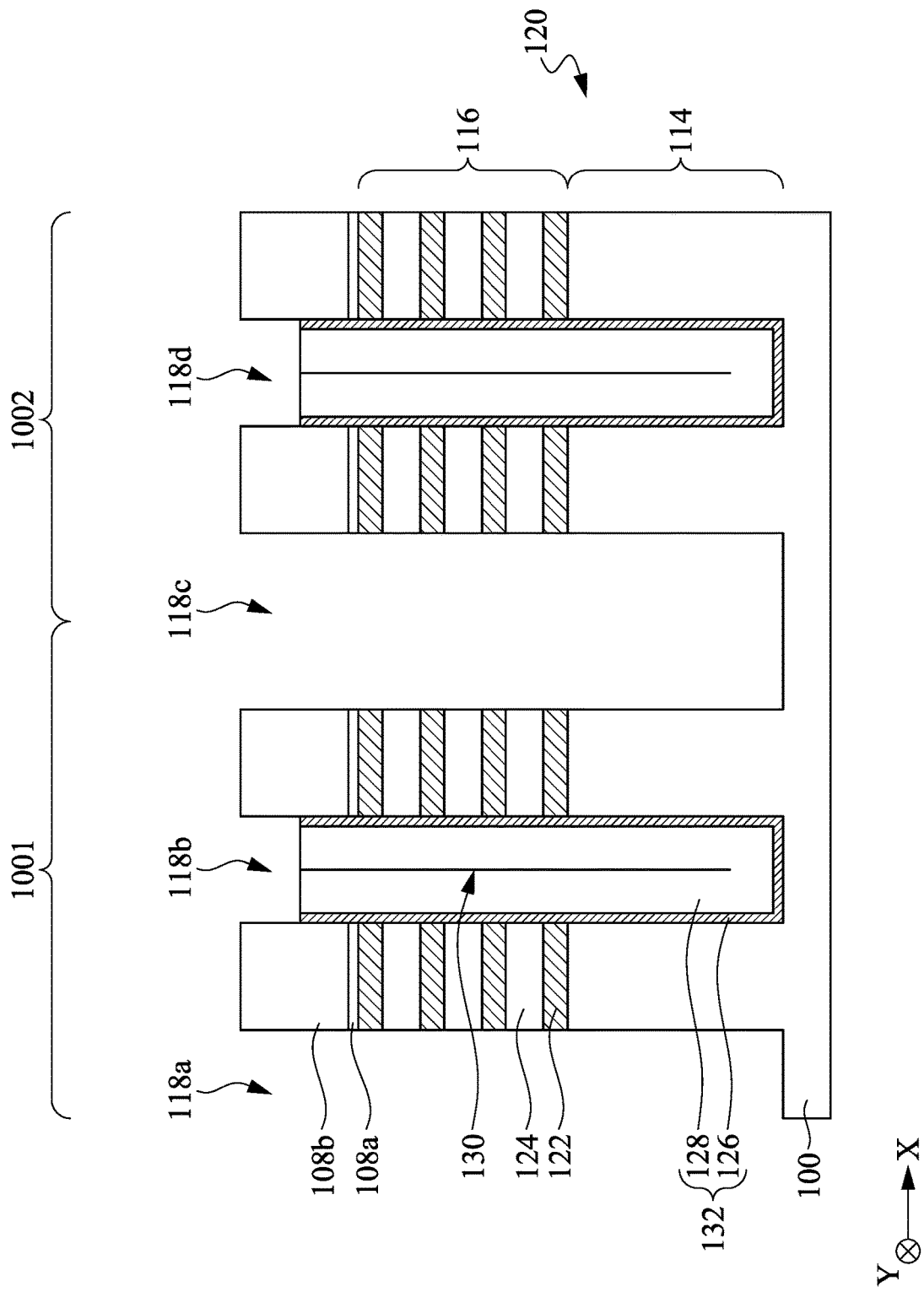

Reference is made to FIG. 4. Subsequently, the example process etches back the first dielectric film 126 and the second dielectric film 128 to remove a portion of the first dielectric film 126 and the second dielectric film 128 in the trenches 118b and 118d and completely remove first dielectric film 126 and the second dielectric film 128 from the trenches 118a and 118c. In some embodiments, the first dielectric film 126 and the second dielectric film 128 may be etched back in a dry etching process that uses oxygen, nitrogen, a fluorine-containing gas (e.g., $CF_4$, SF, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the etch back may include a first stage that is directed toward the second dielectric film 128 and a second stage that is directed toward the first dielectric film 126. Unlike the narrower trenches 118b and 118d which are entirely filled by the first dielectric film 126 and the second dielectric film 128, the wider trenches 118a and 118c allow etchant to etch sidewalls and bottom surface of the first dielectric film 126 and the second dielectric film 128 from inside the trenches 118a and 118c, such that the first dielectric film 126 and the second dielectric film 128 are removed from the wider trenches 118a and 118c in a faster rate than from the narrower trenches 118b and 118d, As shown in FIG. 4, the first dielectric film 126 and the second dielectric film 128 are removed from the wider trenches 118a and 118b, while the first dielectric film 126 and the second dielectric film 128 collectively define dielectric fins 132 in the narrower trenches 118b and 118d, respectively. The dielectric fin 132 has a top at a height between a top of the mask layer 108b and a top of the nanostructure 116. The dielectric fin 132 is between two neighboring fins 120.

Figure 5:
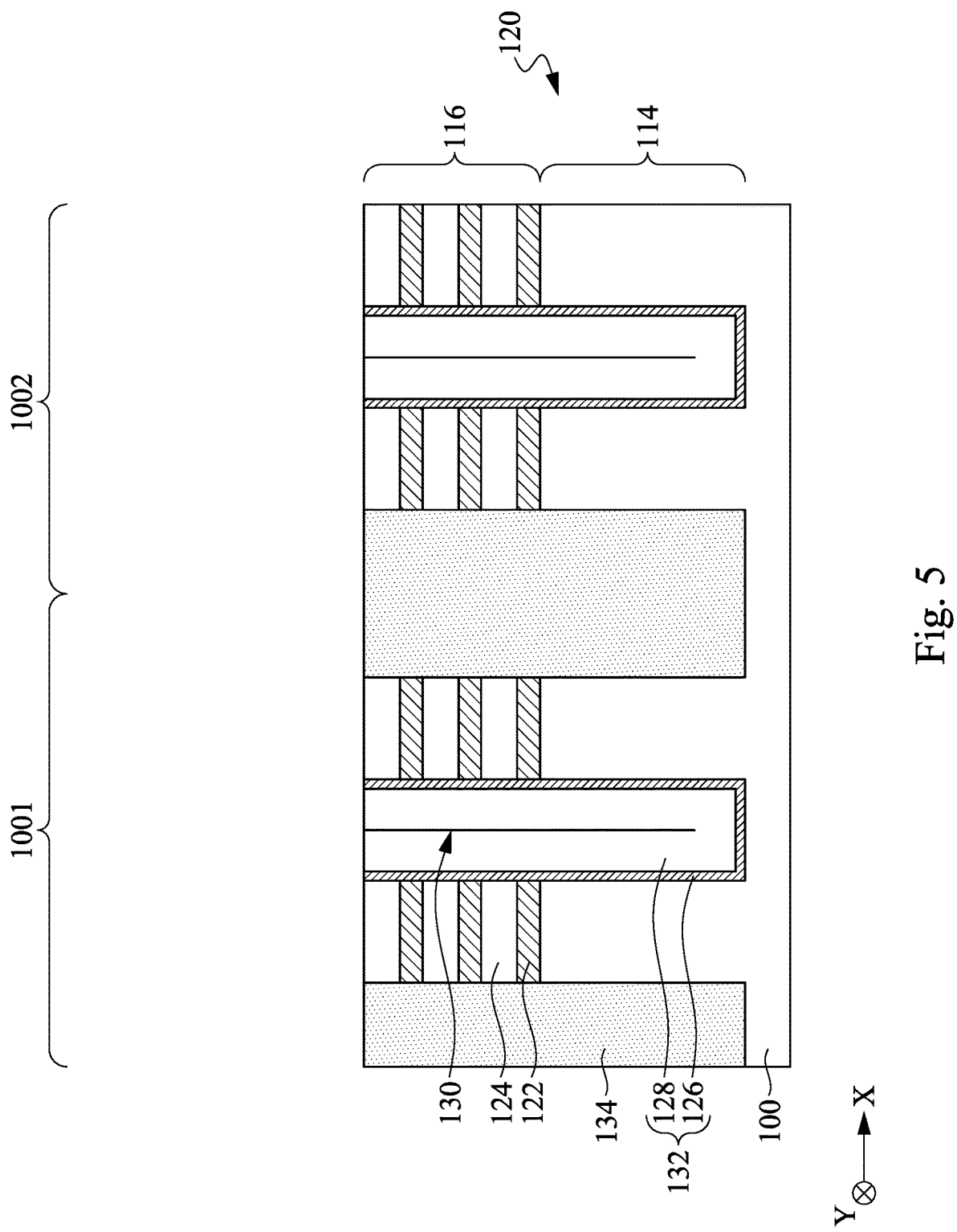

Next, in FIG. 5, an insulation material 134 is formed over the substrate 100 and on opposing sides of the fins 120. The insulation material 134 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 134 is silicon oxide formed by a FCVD process. An anneal process may be performed after the insulation material 134 is formed. The insulation material 134 may have materials different from the materials of the first dielectric film 126 and the second dielectric film 128 to achieve etching selectivity.

In an embodiment, the insulation material 134 is formed such that excess insulation material 134 covers the fins 120. In some embodiments, a liner (not shown) is first formed along surfaces of the substrate 100 and the fins 120, and a fill material, such as those discussed above is formed over the liner. In some embodiments, the liner is omitted. Next, a removal process is applied to the insulation material 134 to remove excess insulation material 134 over the fins 120. The mask layer 108b and the pad layer 108a, and a topmost one of the first nanostructures 122 are removed by the removal process. In some embodiments, a planarization process such as a chemical mechanical polish (CMP), an etch back process, combinations thereof, or the like may be utilized. The planarization process exposes the nanostructures 116 such that top surfaces of the nanostructures 116 and the insulation material 134 are level after the planarization process is complete.

Figure 6:
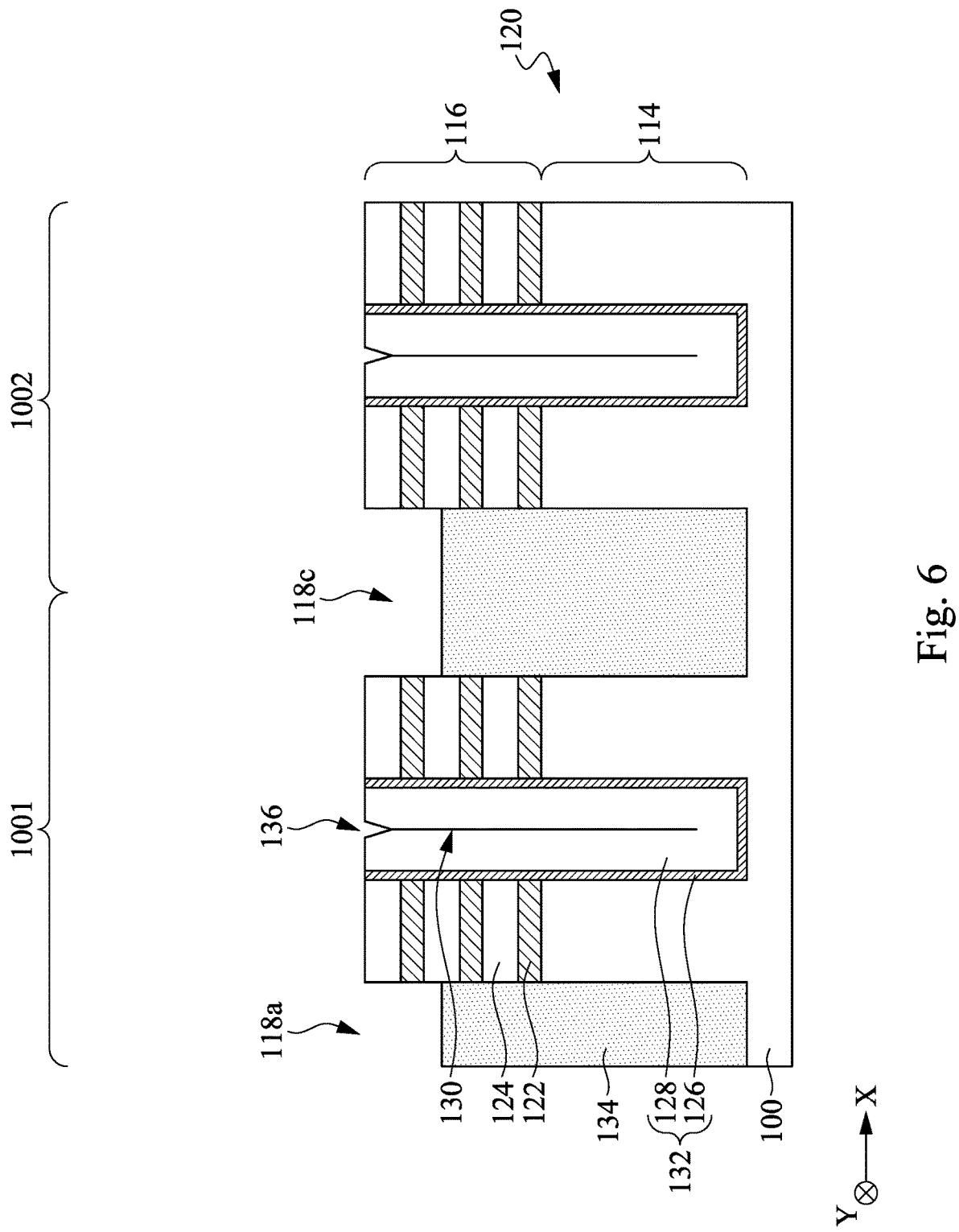

Next, referring to FIG. 6, a first recessing process (e.g., etch back process) is performed to remove a first portion of the insulation material 134. The insulation material 134 is recessed such that an upper portion of the nanostructures 116 and an upper portion of the dielectric fins 132 protrude from between the neighboring insulation material 134 while a lower portion of the nanostructures 116 and a lower portion of the dielectric fins 132 are covered by the insulation material 134. Due to the etch selectivity between the dielectric fin 132 and the insulation material 134, the first recessing process selectively removes the insulation material 134 without substantially damaging the dielectric fin 132. However, since the seams 130 are weak portions of the second dielectric film 128, during the first recessing process, the seams 130 may be etched faster than other portions of the dielectric fin 132, leading formation of gaps 136.

Figure 7:
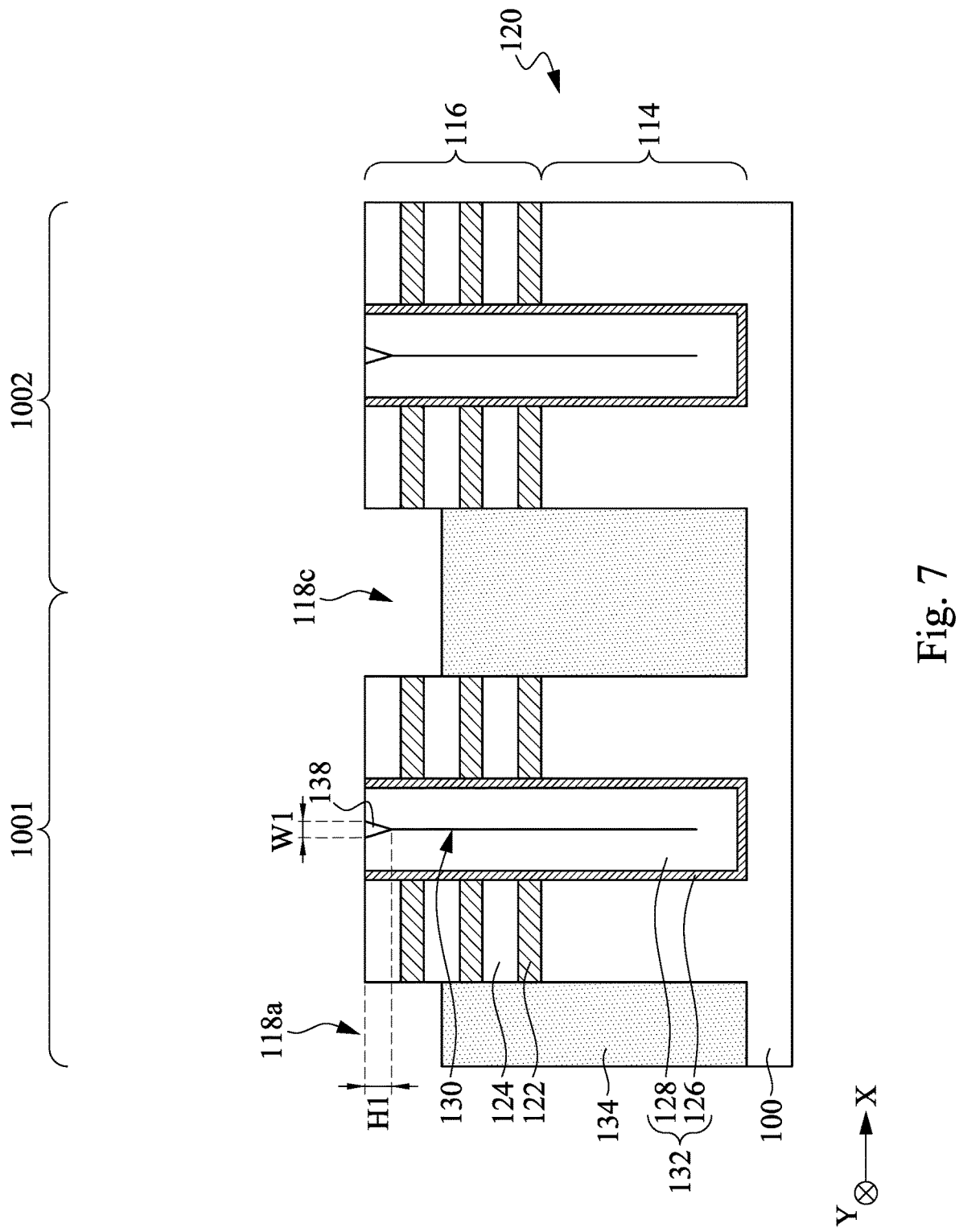

Referring to FIG. 7, a dielectric cap 138 is formed to fill the gaps 136 to enhance etch resistance of the dielectric fin 132. In some embodiments, the dielectric cap 138 may be formed using a conformal deposition process to deposit a dielectric material over the dielectric fin 132, the nanostructures 116 and the insulation material 134, followed by an etch back process. Unlike the tiny gaps 136 which are entirely filled by the dielectric material, the wider trenches 118a and 118c allow etchant to etch sidewalls and bottom surface of the dielectric material from inside the trenches 118a and 118c, such that the dielectric material is removed from inside the trenches 118a and 118c in a faster rate than from the gaps 136. The dielectric cap 138 has a height H1 in a range from 3 nm to 20 nm and a width W1 in a range from 1 nm to 8 nm. The dielectric cap 138 may include SiN, SiCN, SiOC, SiOCN, or a combination thereof.

Figure 8:
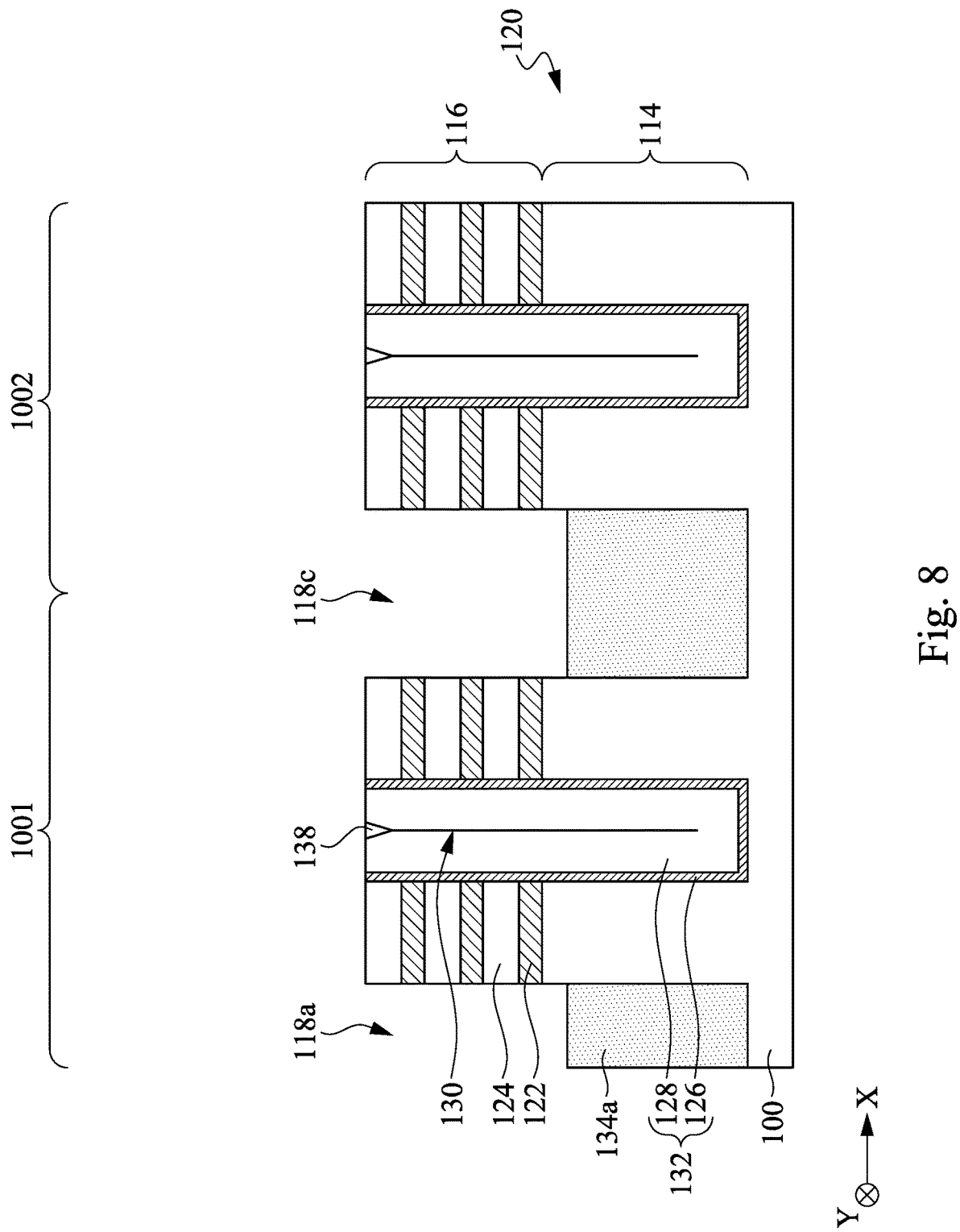

Referring to FIG. 8, a second recessing process (e.g., etch back process) is performed to remove a second portion of the insulation material 134, forming shallow trench isolation (STI) regions 134a. Due to the gaps 136 filled by the dielectric caps 138, the seam 130 will not be further enlarged during the second recessing process. Therefore, a subsequent metal gate and source/drain contact may not form into the seam 130 in the dielectric fin 132, avoiding the shorting issue between a metal gate and a source/drain contact.

Figure 9:
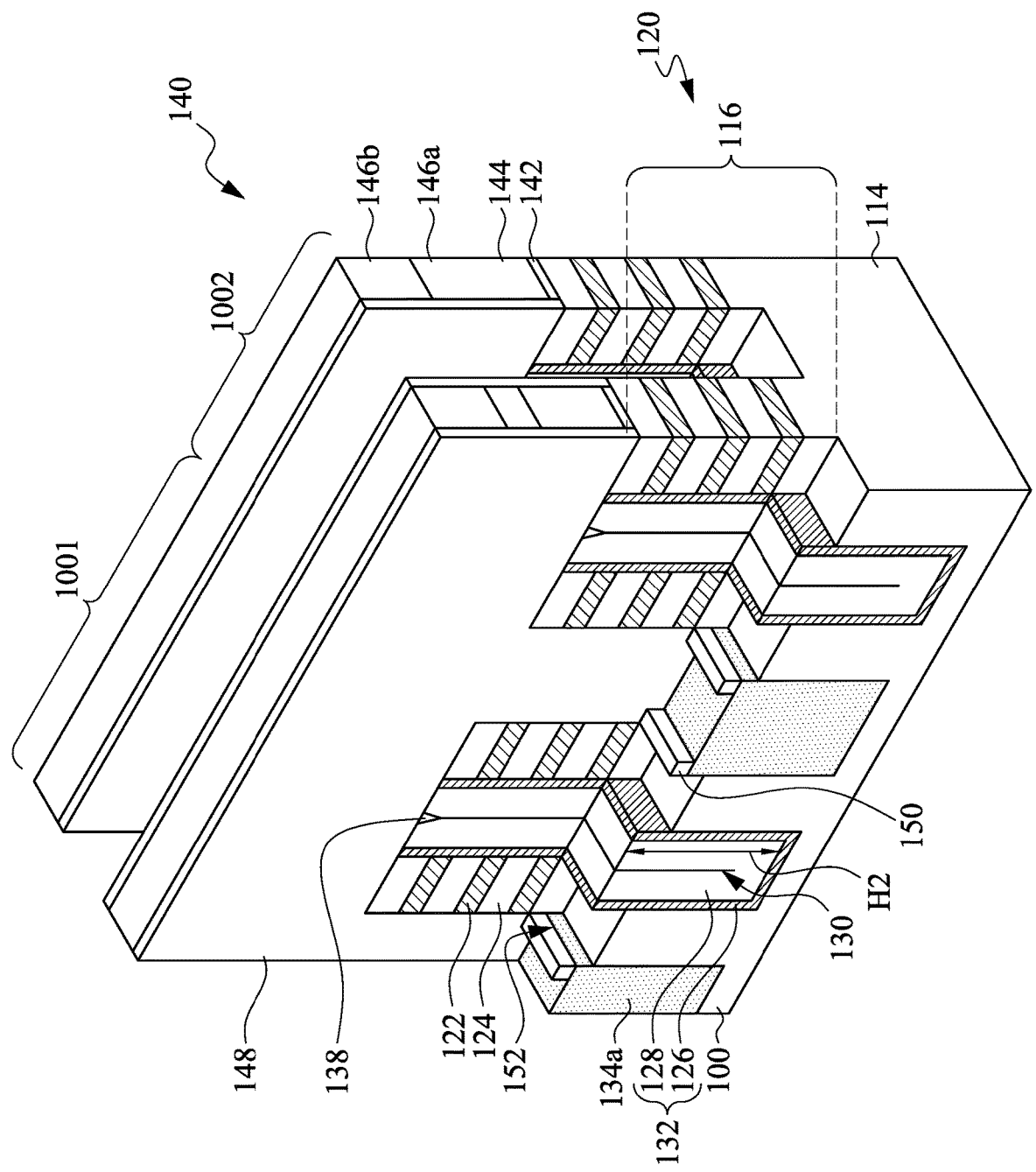
FIGS. 9, 10, 11, 12, 13A are perspective views of a method of manufacturing a semiconductor device at various stages in accordance with some embodiments.

Referring to FIG. 9, a gate structure 140 is formed over the fins 120. The gate structure 140 includes a dummy gate stack (represented by a dummy gate electrode 144 and in some implementations, a dummy gate dielectric 142), gate spacers 148, and a hard mask including multiple layers (e.g., a pad layer 146a and a mask layer 146b). The gate structure 140 is disposed over channel region of the fins 120. The dummy gate electrode 144 includes a suitable dummy gate material, such as polysilicon. In implementations where the dummy gate stack includes a dummy gate dielectric disposed between the dummy gate electrode 144 and the fins 120, the dummy gate dielectric 142 includes a dielectric material, such as silicon oxide, a high-k dielectric material, other suitable dielectric material, or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. The dummy gate stack can include numerous other layers, for example, capping layers, interface layers, diffusion layers, barrier layers, hard mask layers, or combinations thereof. In some implementations, the dummy gate stack further includes an interfacial layer (including, for example, silicon oxide) disposed between the dummy gate electrode 144 and the dummy gate dielectric 142. In some implementations, a capping layer (including, for example, titanium and nitrogen (such as a TN capping layer)) can be disposed between the dummy gate electrode 144 and the fins 120.

The gate structure 140 is formed by deposition processes, lithography processes, etching processes, other suitable processes, or combinations thereof. For example, a deposition process is performed to form a dummy gate electrode layer over the substrate 100, particularly over the fins 120 and the STI regions 134a. In some implementations, a deposition process is performed to form a dummy gate dielectric layer over the fins 120 before forming the dummy gate electrode layer, where the dummy gate electrode layer is formed over the dummy gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some implementations, the dummy gate dielectric layer) to form the dummy gate stack, such that the dummy gate stack (including the dummy gate electrode 144, the dummy gate dielectric 142, and/or other suitable layers) wraps a portion of channel region. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Gate spacers 148 are formed adjacent to the dummy gate stack of the gate structure 140. Fin spacers 150 are formed on tops of the STI regions 134a. For example, the gate spacers 148 are disposed adjacent to (for example, along sidewalls of) the dummy gate electrode 144. The gate spacers 148 and the fin spacers 150 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over the fins 120 and the STI regions 34a and subsequently anisotropically etched to form the gate spacers 148 and the fin spacers 150. In some implementations, the fin spacers 150 and the gate spacers 244 include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to the dummy gate stack. In such implementations, the various sets of spacers can include materials having different etch rates. For example, a first dielectric layer including silicon and oxygen (for example, silicon oxide) can be deposited over the fins 120 and the STI regions 134a and subsequently anisotropically etched to form a first spacer set adjacent to the dummy gate stack and on the STI regions 134a, and a second dielectric layer including silicon and nitrogen (for example, silicon nitride) can be deposited over the fins 120 and the STI regions 134a and subsequently anisotropically etched to form a second spacer set adjacent to the first spacer set.

Source/drain recesses 152 are formed in the nanostructures 116 and the substrate 100, in accordance with some embodiments. Epitaxial source/drain regions will be subsequently formed in the source/drain recesses 152. The source/drain recesses 152 may extend through the first nanostructures 122 and the second nanostructures 124, and into the substrate 100. Bottom surfaces of the source/drain recesses 152 are lower than top surfaces of the STI regions 134a, as an example. In some other embodiments, the fin structures 114 may be etched such that bottom surfaces of the source/drain recesses 152 are level with the top surfaces of the STI regions 134a. The source/drain recesses 152 may be formed by etching the nanostructures 116 and the substrate 100 using anisotropic etching processes, such as RIE, NBE, or the like. The gate spacers 148 and the mask layer 146b protect portions of the fin structures 114, the nanostructures 116, and the substrate 100 during the etching processes used to form the source/drain recesses 152. A single etch process or multiple etch processes may be used to etch each layer of the nanostructures 116 and/or the fin structures 114. Timed etch processes may be used to stop the etching of the source/drain recesses 152 after the source/drain recesses 152 reach a target depth.

A recessing process (e.g., etch back process) is performed to remove a portion of the dielectric fin 132 so that the dielectric fin 132 has a reduced height H2. A vertical distance between a top surface of the fin spacers 150 and a top surface of the recessed fin structure 114 is substantially the same as a distance between a top surface of the recessed dielectric fin 132 and the top surface of the recessed fin structure 114. In other words, the top surfaces of the dielectric fin 132 and the fin spacers 150 are at the same level heights. Because the dielectric fin 132 has the reduced height H2, top of the dielectric fin 132 may not touch a subsequent source/drain contact. In other words, the dielectric fin 132 can be separated from the subsequent source/drain contact. That is, the seam 130 in the dielectric fin 132 can be separated from the subsequent source/drain contact, preventing the source/drain contact from filling into the seam 130. Therefore, shorting issue between a metal gate and a source/drain contact can be avoided.

Portions of sidewalls of the layers of the nanostructures 116 formed of the first semiconductor materials (e.g., the first nanostructures 122) exposed by the source/drain recesses 152 are etched to form sidewall recesses between corresponding second nanostructures 124. Although sidewalls of the first nanostructures 122 in recesses are illustrated as being straight in FIG. 10, the sidewalls may be concave or convex. The sidewalls may be etched using isotropic etching processes, such as wet etching or the like. In some embodiments in which the first nanostructures 122 include, e.g., SiGe, and the second nanostructures 124 include, e.g., Si or SiC, a dry etch process with tetramethylammonium hydroxide (TMAH), ammonium hydroxide ($NH_4OH$), or the like may be used to etch sidewalls of the first nanostructures 122.

Figure 10:
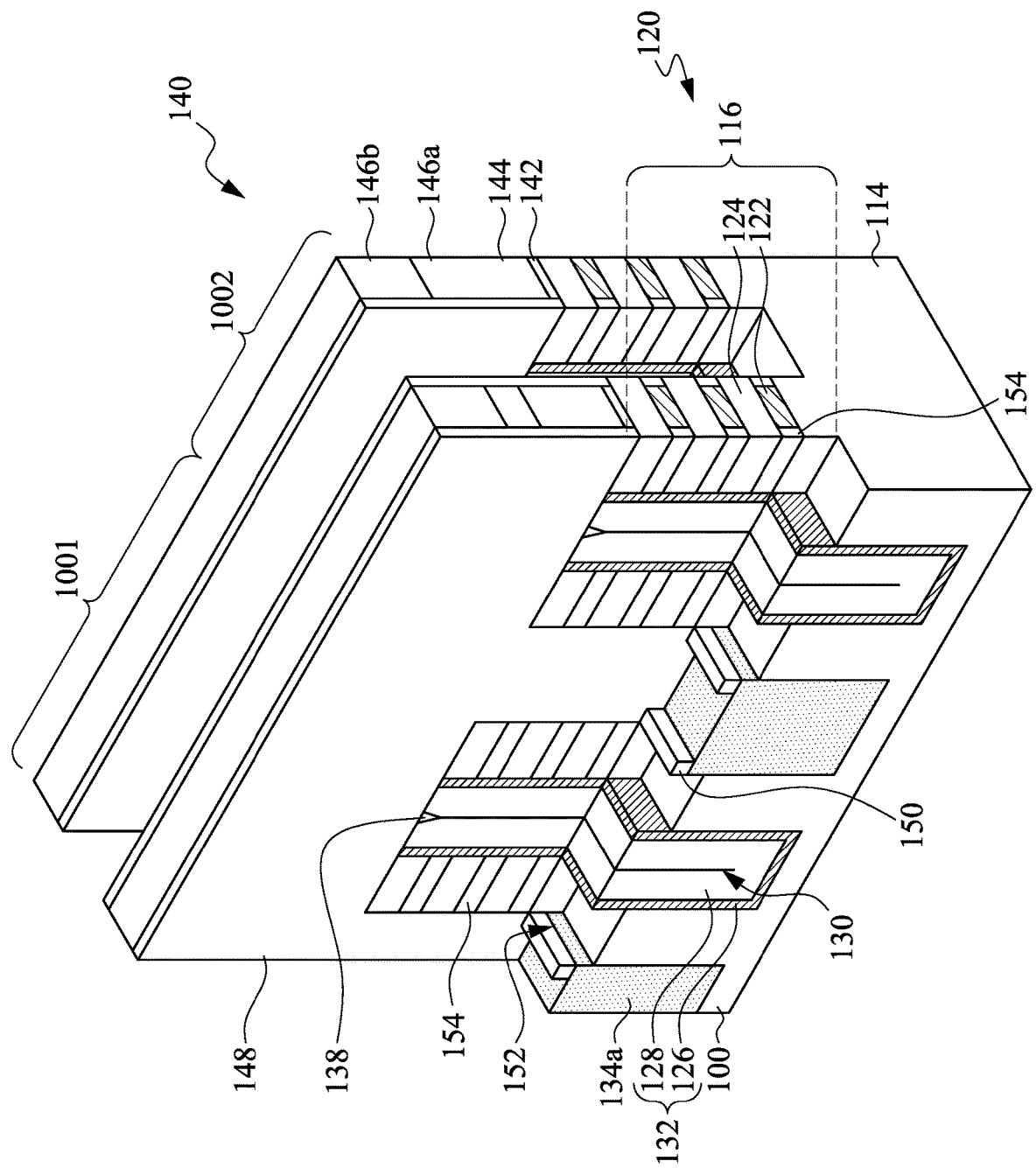

Inner spacers 154 are formed in the sidewall recess, as shown in FIG. 10. The inner spacers 154 act as isolation features between subsequently formed source/drain regions and gate structure. As will be discussed in greater detail below, source/drain regions will be formed in the source/drain recesses 152, and the first nanostructures 122 will be replaced with corresponding gate structures.

The inner spacers 154 may be formed by depositing an inner spacer layer using conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 154. Although outer sidewalls of the inner spacers 154 are illustrated as being flush with sidewalls of the second nanostructures 124, the outer sidewalls of the inner spacers 154 may extend beyond or be recessed from sidewalls of the second nanostructures 124.

Moreover, although the outer sidewalls of the inner spacers 154 are illustrated as being straight in FIG. 10, the outer sidewalls of the inner spacers 154 may be concave or convex. The inner spacer layer may be etched by an anisotropic etching process, such as RIE, NBE, or the like. The inner spacers 154 may be used to prevent damage to subsequently formed source/drain regions (such as the epitaxial source/drain regions 156 and 158, discussed below with respect to FIG. 11) by subsequent etching processes, such as etching processes used to form gate structures.

Figure 11:
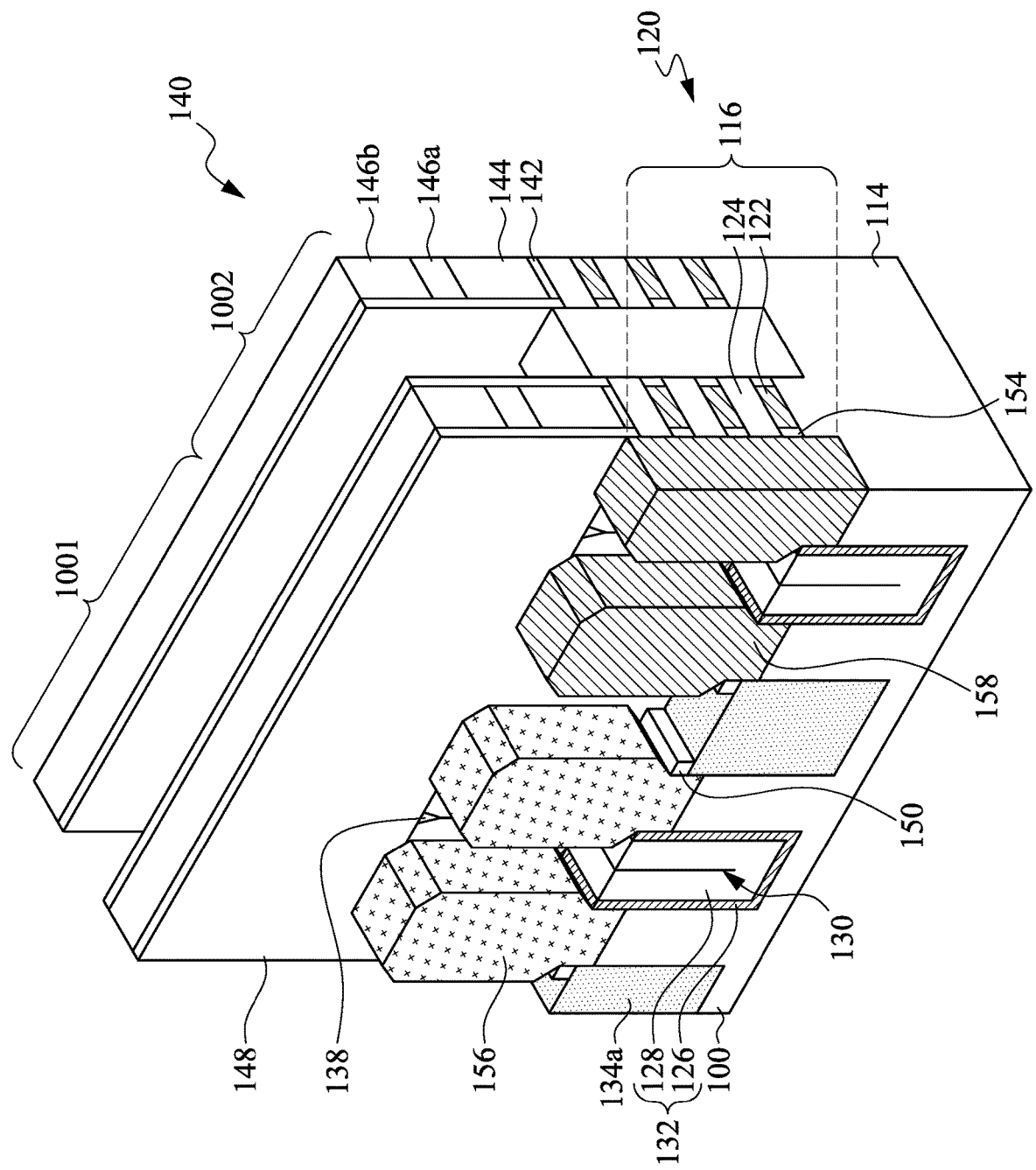

Epitaxial source/drain regions 156 and 158 are formed in the source/drain recesses 152, as shown in FIG. 11. In some embodiments, the source/drain regions 156 and 158 may exert stress on the second nanostructures 124, thereby improving device performance. As illustrated in FIG. 11, the epitaxial source/drain regions 156 and 158 are formed in the source/drain recesses 152 such that each gate structure 140 is disposed between respective neighboring pairs of the epitaxial source/drain regions 156 and 158. In some embodiments, the gate spacers 148 are used to separate the epitaxial source/drain regions 156 and 158 from the dummy gate electrode 144 and the inner spacers 154 are used to separate the epitaxial source/drain regions 156 and 158 from the first nanostructures 122 by an appropriate lateral distance so that the epitaxial source/drain regions 156 and 158 do not short out with subsequently formed gates of the resulting GAA-FETs.

In some embodiments, the epitaxial source/drain regions 156 and 158 may include any acceptable material appropriate for n-type GAA-FETs. For example, if the second nanostructures 124 are silicon, the epitaxial source/drain regions 232 may include materials exerting a tensile strain on the second nanostructures 204, such as silicon carbide, phosphorous doped silicon carbide, silicon phosphide, or the like. In some embodiments, the epitaxial source/drain regions 156 and 158 may include any acceptable material appropriate for p-type GAA-FETs. For example, if the second nanostructures 124 are silicon, the epitaxial source/drain regions 156 and 158 may include materials exerting a compressive strain on the second nanostructures 124, such as silicon germanium, boron doped silicon germanium, germanium, germanium tin, or the like. The epitaxial source/drain regions 156 and 158 may have surfaces raised from respective upper surfaces of the nanostructures 116 and may have facets.

The epitaxial source/drain regions 156 and 158 may be implanted with dopants to form source/drain regions, followed by an anneal. The n-type and/or p-type impurities for source/drain regions 156 and 158 may be any of the impurities previously discussed. In some embodiments, the epitaxial source/drain regions 156 and 158 may be in situ doped during growth.

As a result of the epitaxy processes used to form the epitaxial source/drain regions 156 and 158, upper surfaces of the epitaxial source/drain regions 156 and 158 have facets which expand laterally outward beyond sidewalls of the nanostructures 116. In some other embodiments, adjacent epitaxial source/drain regions 156 and 158 remain separated after the epitaxy process is completed as illustrated by FIG. 11. The fin spacers 150 and the dielectric fin 132 block the lateral epitaxial growth of the epitaxial source/drain regions 156 and 158. Due to the tops of the fin spacers 150 and the dielectric fins 132 are at substantially the same level heights, the epitaxial source/drain regions 156 and 158 are each symmetric with respect to a z-axis perpendicular to the top surface of substrate 100.

Figure 12:
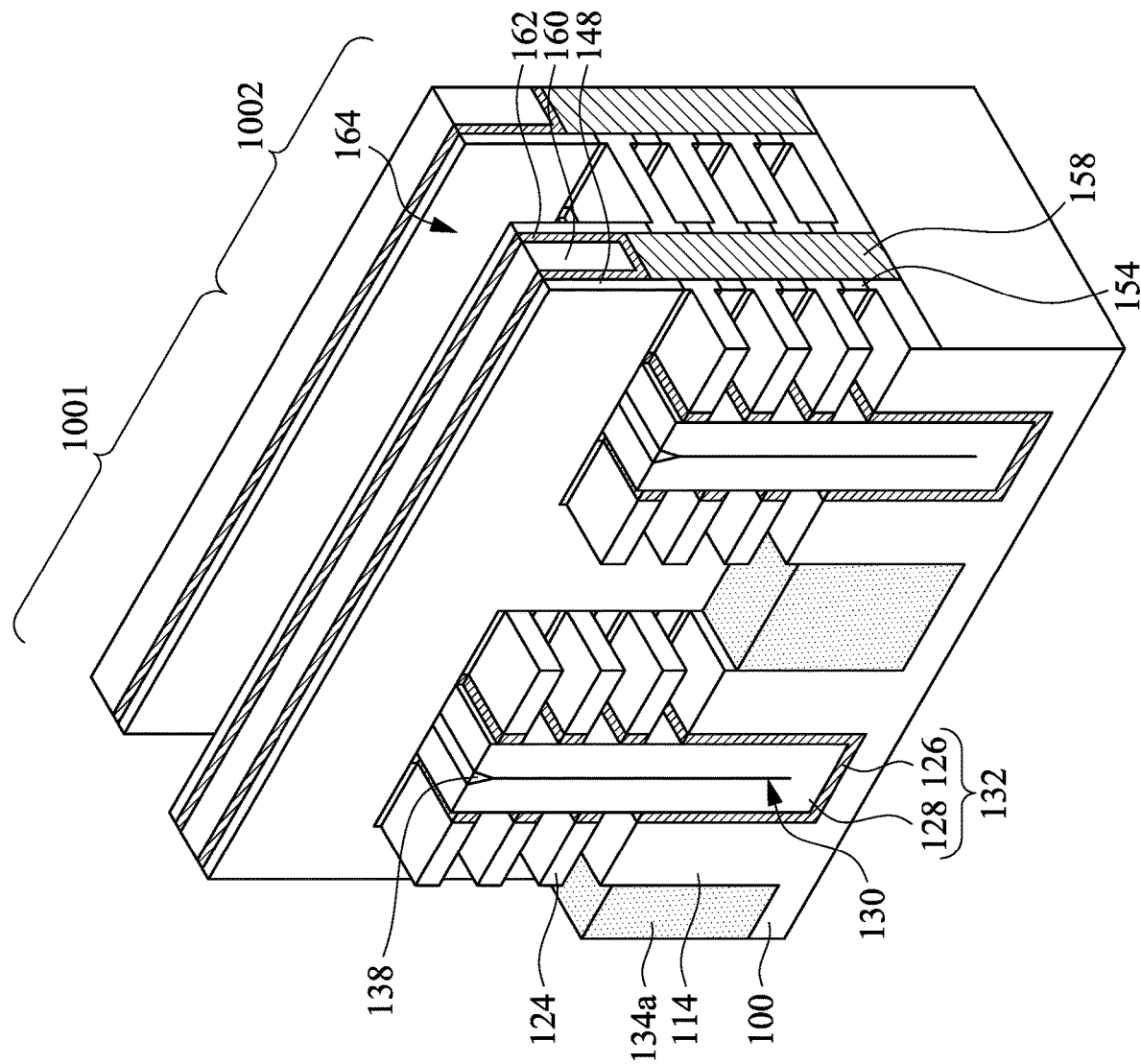

In FIG. 12, an interlayer dielectric (ILD) layer 160 is deposited over the structure illustrated in FIG. 11. The ILD layer 160 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 162 is disposed between the ILD layer 160 and the epitaxial source/drain regions 156 and 158, and the gate spacers 148. The CESL 162 may include a dielectric material, such as, silicon nitride, silicon oxide, silicon oxynitride, or the like, having a different etch rate than the material of the overlying ILD layer 160.

A planarization process, such as a CMP, may be performed to remove the hard mask including the pad layer 146a and the mask layer 146b on the dummy gate electrode 144. The planarization process levels the top surface of the ILD layer 160 with the top surfaces of dummy gate electrode 144.

In FIG. 12, the dummy gate stacks (i.e., the dummy gate electrode 144 and the dummy gate dielectric 142) are removed in one or more etching steps, so that gate trenches 164 are formed between corresponding gate spacers 148. In some embodiments, the dummy gate stacks are removed by an anisotropic dry etch process. For example, the etching process may include a dry etch process using reaction gas(es) that selectively etch the dummy gate at a faster rate than the ILD layer 160. Each gate trench 164 exposes and/or overlies portions of nanostructures 116, which act as channel regions in subsequently completed GAA-FETs. The nanostructures 116 which act as the channel regions are disposed between neighboring pairs of the epitaxial source/drain regions 156 and 158. During the removal, the topmost one of the second nanostructure 124 may be used as etch stop layers when the dummy gate stacks are etched.

The first nanostructures 122 in the gate trenches 164 are then removed by an isotropic etching process such as wet etching or the like using etchants which are selective to the materials of the first nanostructures 122. Stated differently, the first nanostructures 122 are removed by using a selective etching process that etches the first nanostructures 122 at a faster etch rate than it etches the second nanostructures 124, thus forming spaces between the second nanostructures 124 (also referred to as sheet-sheet spaces if the nanostructures 124 are nanosheets). This step can be referred to as a channel release process. As illustrated in FIG. 11, gaps 166 (empty spaces) are formed between the second nanostructures 124. At this interim processing step, the gaps 166 between second nanostructures 124 may be filled with ambient environment conditions (e.g., air, nitrogen, etc). In some embodiments, the second nanostructures 124 can be referred to as nanosheets, nanowires, nanoslabs, nanorings having nanoscale size (e.g., a few nanometers), depending on their geometry. For example, in some embodiments the second nanostructures 124 may be trimmed to have a substantial rounded shape (i.e., cylindrical) due to the selective etching process for completely removing the first nanostructures 122. In that case, the resultant second nanostructures 124 can be called nanowires.

In embodiments in which the first nanostructures 122 include, e.g., SiGe, and the second nanostructures 124 include, e.g., Si or SiC, tetramethylammonium hydroxide (TMAH), ammonium hydroxide (NH$_4$OH) or the like may be used to remove the first nanostructures 122. In some embodiments, both the channel release step and the previous step of laterally recessing first nanostructures 122 (i.e., the step as illustrated in FIG. 10) use a selective etching process that etches first nanostructures 122 (e.g., SiGe) at a faster etch rate than etching second nanostructures 124 (e.g., Si), and therefore these two steps may use the same etchant chemistry in some embodiments. In this case, the etching time/duration of channel release step is longer than the etching time/duration of the previous step of laterally recessing first nanostructures 122, so as to completely remove the sacrificial nanostructures 122.

The first dielectric film 126 exposed by the gaps 136 are removed such that the second dielectric film 128 is exposed by the gaps 136. The first dielectric film 126 can be removed by an isotropic etching process such as wet etching or the like using etchants which are selective to the materials of the first dielectric film 126. Stated differently, the first dielectric film 126 are removed by using a selective etching process that etches the first dielectric film 126 at a faster etch rate than it etches the second dielectric film 128.

Next, in FIGS. 13A-13C, high-k/metal gate structures are formed. As shown in cross-sectional view of FIG. 13B, the dielectric fin 132 and corresponding neighboring second nanostructures 124 collectively have a fishbone shape or a fork-sheet shape. In some cases, the first dielectric film 126 may be trimmed to have a reduced vertical thickness before forming the high-k/metal gate structure. FIG. 13C is an enlarged view of a region R1 in FIG. 13B, in some embodiments, the second nanostructure 124 and the second dielectric film 128 have a lateral distance S5 controlled to within in a range from 3 nm to 5 nm. That is, the first dielectric film 126 has a lateral width in a range from 3 nm to 5 nm. A top surface of the second nanostructure 124 and a top surface of the first dielectric film 126 has a vertical distance S4 controlled to within in a range from 0 nm to 2 nm. If the lateral distance S5 and the vertical distance S4 are out of the corresponding range, the short channel effect (SCE) is difficult to be controlled and costly alternating current (AC) performance penalties cannot be avoided.

In high-k/metal gate structures, for example, a gate dielectric layer 172 is formed (e.g., conformally) in the gate trenches 164 and in the gaps 166. The gate dielectric layer 172 wraps around the second nanostructures 124, lines sidewalls of the inner spacers 154 and sidewalls of the gate spacers 148, and extends along the upper surface of the fin structures 114. In accordance with some embodiments, the gate dielectric layer 172 includes silicon oxide, silicon nitride, or multilayers thereof. In some embodiments, the gate dielectric layer 172 includes a high-k dielectric material, and in these embodiments, the gate dielectric layer 172 may have a dielectric constant greater than about 7.0, and may include a metal oxide or a silicate of Hf, Al, Zr, La, Mg, Ba, Ti, or Pb, or combinations thereof. The formation methods of the gate dielectric layer 172 may include Molecular-Beam Deposition (MBD), ALD, PECVD, and the like.

In an alternative embodiment, an interfacial layer 170 is deposited between the gate dielectric layer 172 and the second nanostructures 124 and is formed of silicon oxide or silicon oxynitride grown by a thermal oxidation process. For example, the interfacial layer can be grown by a rapid thermal oxidation (RTO) process or by an annealing process using oxygen.

Next, a gate electrode material (e.g., an electrically conductive material) is formed in the gate trenches 164 and in the gaps 166 to form the gate electrodes 174. The gate electrodes 174 fill the remaining portions of the gate trenches 164 and in the gaps 166. For example, the gate electrodes 174 include one or more work function layers (not shown) and a fill metal layer (not shown). A CMP is then performed on the gate electrodes 174 and the gate dielectric layer 172 until the ILD layer 160 is exposed, resulting in the gate electrodes 174, the gate dielectric layer 172, the CESL 162, and the ILD layer 160 having substantially level top surfaces. The interfacial layer 170, the gate electrodes 174 and the gate dielectric layer 172 are collectively referred to as metal gate structures 168.

The one or more work function layers can provide a suitable work function for the high-k/metal gate structures. For an n-type GAA FET, the one or more work function layers may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or ofther suitable materials. On the other hand, for a p-type GAA FET, the one or more work function layers may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal layer may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

The ILD layer 160 and the CESL 162 are etched to form contact openings. The etching may be performed using, for example, Reactive Ion Etch (RIE). In a subsequent step, as shown in FIGS. 14A and 14B, source/drain contact plugs 176 are formed in the contact openings. Before forming the source/drain contact plugs 176, the portions of CESL 162 exposed to the contact openings are first etched, revealing epitaxy regions 156 and 158.

The ILD layer 160 has a portion between the epitaxial source/drain regions 156 having a top width W4 smaller than a bottom width W5. In accordance with some embodiments of the present disclosure, the source/drain contact plugs 176 include barrier layers and a metal-containing material over the respective barrier layers. In accordance with some embodiments of the present disclosure, the formation of the source/drain contact plugs 176 includes forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may be formed of tungsten, cobalt, copper, or the like. A vertical distance T1 between the source/drain contact plugs 176 and the dielectric fin 132 is small enough to prevent the source/drain contact plugs 176 from being in contact with the dielectric fin 132. For example, the vertical distance T1 is greater than 10 nm. If the vertical distance T1 is less than 10 nm, the source/drain contact plugs 176 is likely to be in contact with the dielectric fin 132 and fill into the seam 130, leading to shorting between the source/drain contact plugs 176 and the metal gate structures 168.

FIGS. 15-20 are cross-sectional views of a method of manufacturing a semiconductor device at various stages in accordance with some embodiments. FIGS. 21, 22, 23, and 24A are perspective views of a method of manufacturing a semiconductor device at various stages in accordance with some embodiments. FIG. 24B is a cross-sectional view corresponding to line X3-X3 of FIG. 24A according to some embodiments of the present disclosure. FIG. 25A is a perspective view of a method of manufacturing a semiconductor device at various stages in accordance with some embodiments. FIG. 25B is a cross-sectional view corresponding to line X4-X4 of FIG. 25A according to some embodiments of the present disclosure. FIG. 25C is an enlarged view of a region in FIG. 25B.

Figure 15:
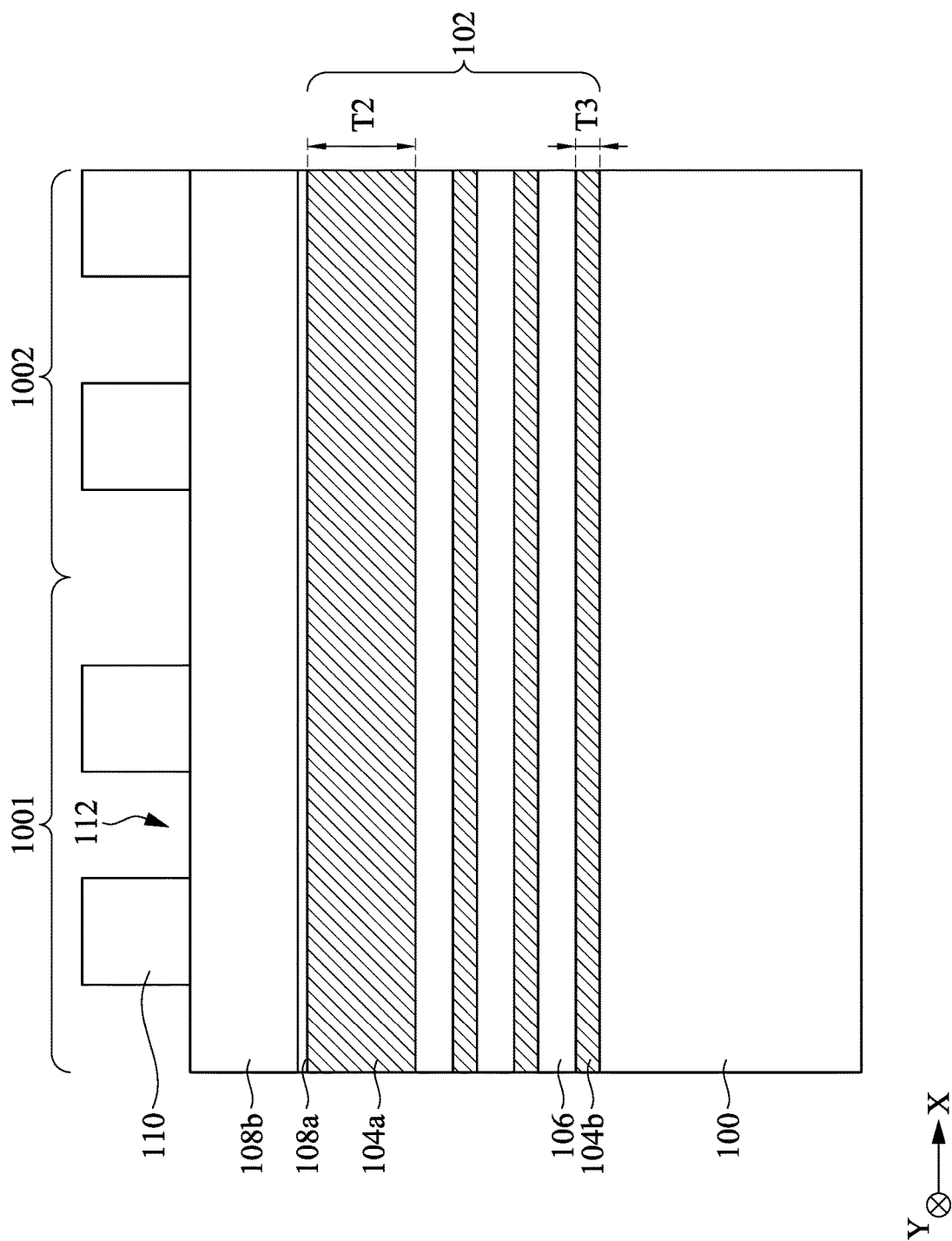
FIGS. 15-20 are cross-sectional views of a method of manufacturing a semiconductor device at various stages in accordance with some embodiments.

FIG. 15 shows substantially the same structure as FIG. 1, except the topmost first semiconductor layer 104a being thicker than other first semiconductor layers 104. For example, the topmost first semiconductor layer 104a has a thickness T2 greater than a thickness T3 of a bottommost first semiconductor layers 104b. By the topmost first semiconductor layer 104a being thicker than other first semiconductor layers 104, a subsequent dielectric fin can have an increased thickness. Formation of the multi-layer stack 102, the pad layer 108a, the mask layer 108b and the photo resist 110 is discussed previously with respect to FIG. 1, and the detailed description thereof is thus not repeated for the sake of brevity.

Figure 16:
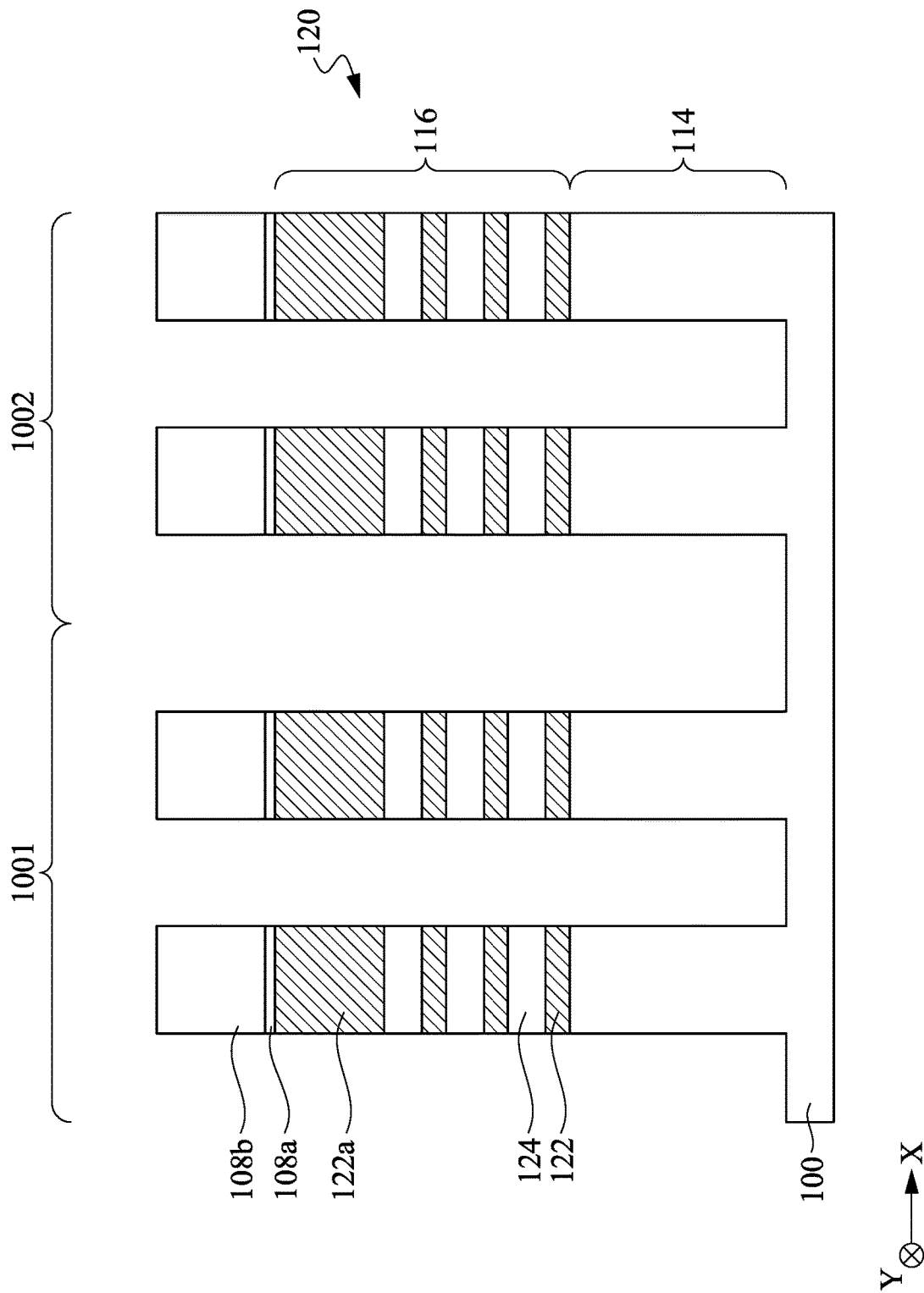

Referring to FIG. 16, fin structures 114 are formed in the substrate 100 and nanostructures 116 are formed in the multi-layer stack 102, in accordance with some embodiments. Each fin structure 114 and overlying nanostructures 116 can be collectively referred to as a fin 120 extending from the substrate 100. The topmost first nanostructure 122a is thicker than other first nanostructures 122. Formation of the fin structures 114 and the nanostructures 116 is discussed previously with respect to FIG. 2, and the detailed description thereof is thus not repeated for the sake of brevity.

Figure 17:
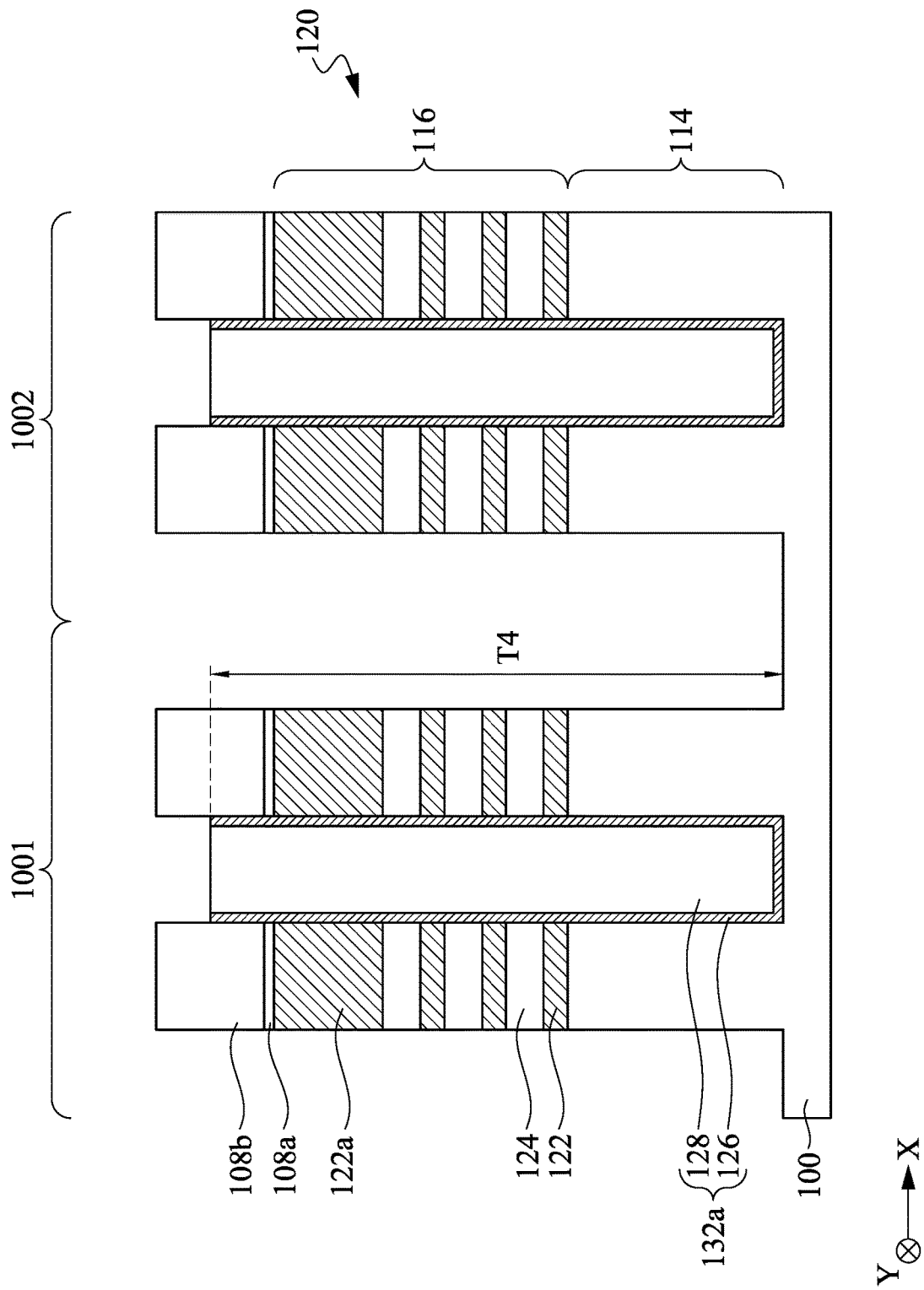

Referring to FIG. 17, a dielectric fin 132a including a first dielectric film 126 and a second dielectric film 128 over the first dielectric film 126 is formed between neighboring fins 120. Formation of the dielectric fin 132a is discussed previously with respect to FIGS. 3 and 4 and the detailed description thereof is thus not repeated for the sake of brevity. Because the topmost first nanostructure 122a has an increased thickness as discussed previously, the dielectric fin 132a has an increased thickness T4.

Figure 18:
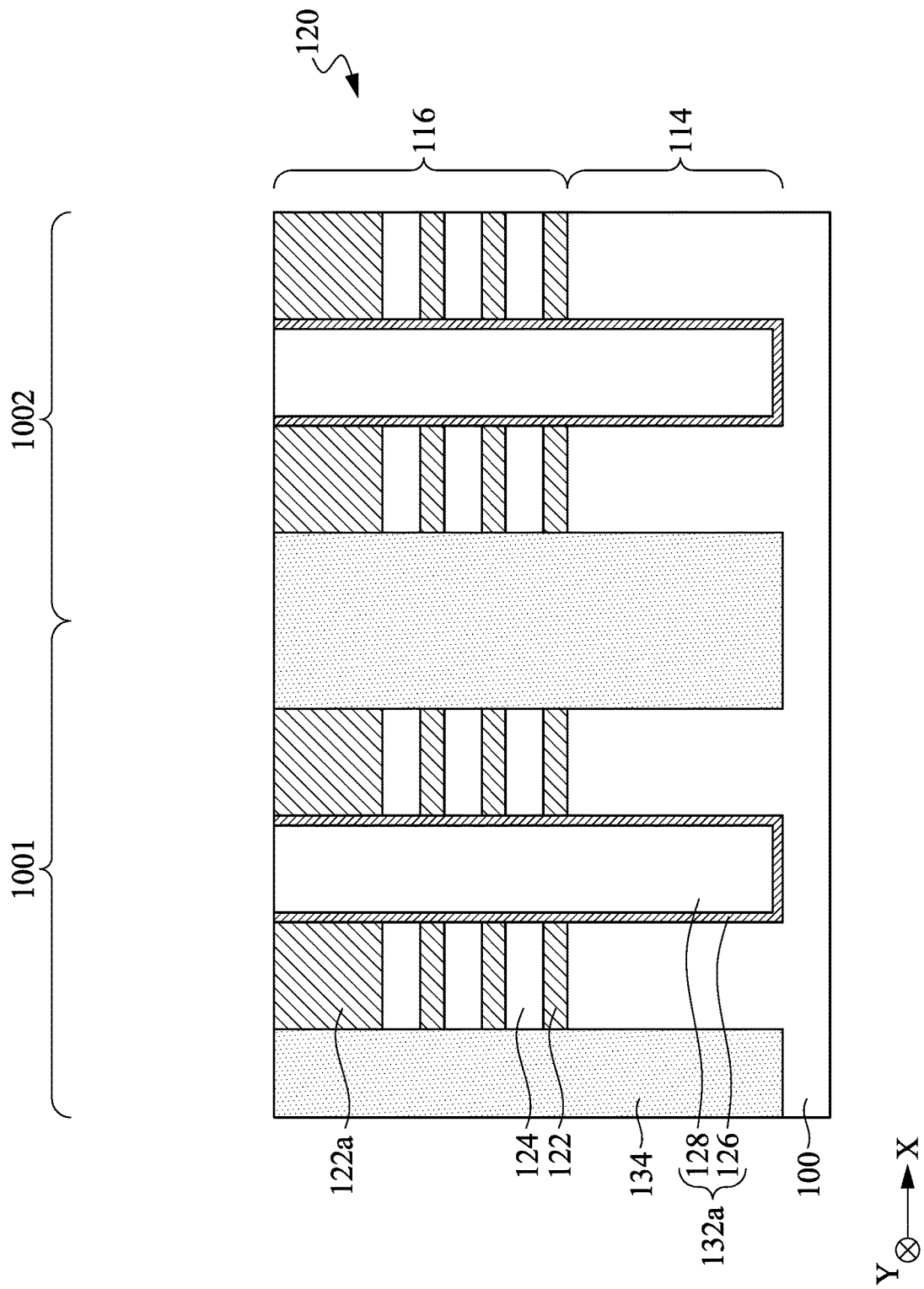

Next, in FIG. 18, an insulation material 134 is formed over the substrate 100 and on opposing sides of the fins 120. Formation of the insulation material 134 is discussed previously with respect to FIG. 5, and the detailed description thereof is thus not repeated for the sake of brevity.

Figure 19:
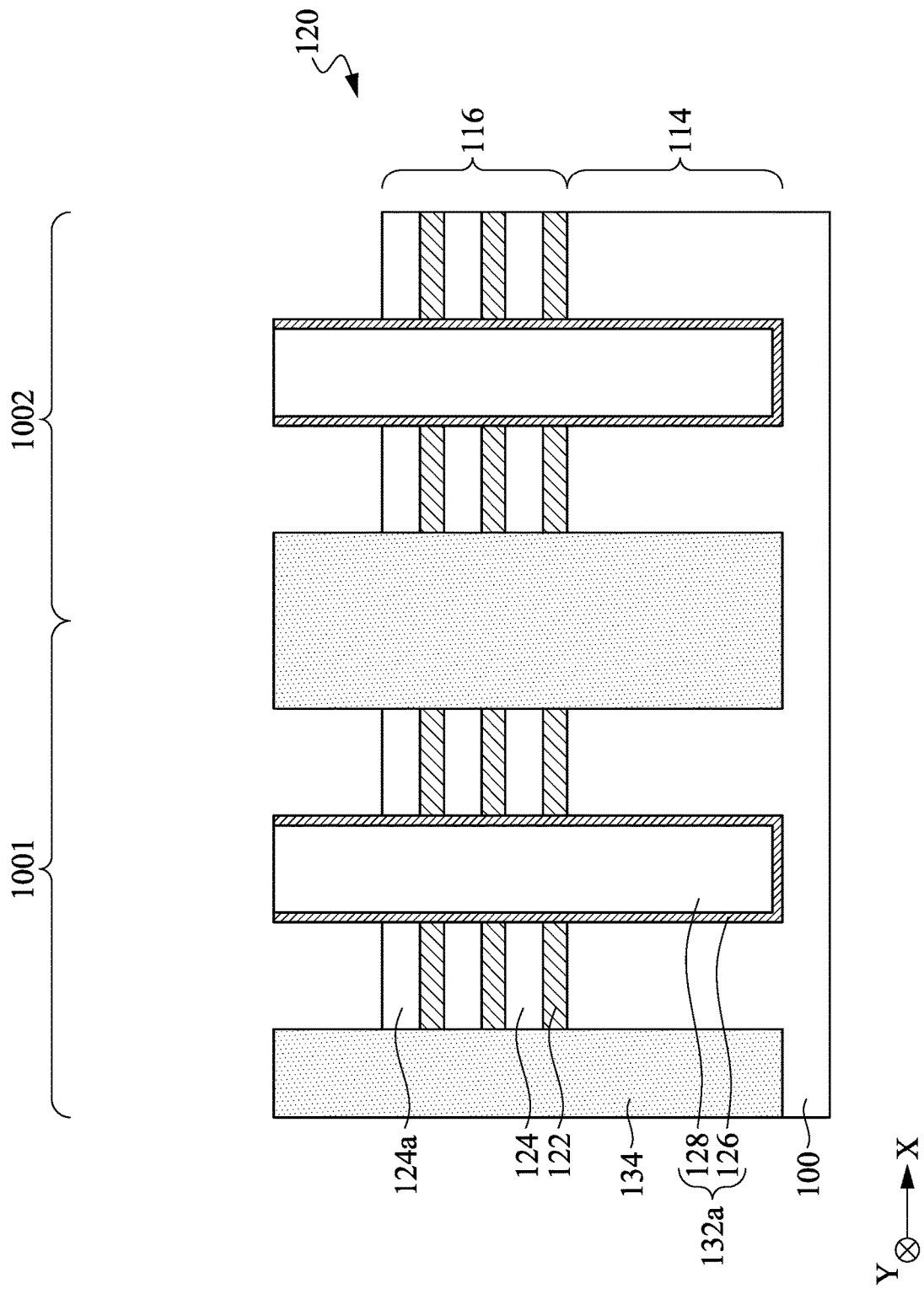

In FIG. 19, an etching process is performed to remove the topmost first nanostructure 122a, exposing a topmost second nanostructure 124a. In some embodiments in which the first nanostructures 122 include, e.g., SiGe, and the second nanostructures 124 include, e.g., Si or SiC, a dry etch process with tetramethylammonium hydroxide (TMAH), ammonium hydroxide ($NH_4OH$), or the like may be used to remove the topmost first nanostructure 122a. Due to the etch selectivity between the topmost first nanostructure 122a and the topmost second nanostructure 124a, the etching process selectively removes the topmost first nanostructure 122a without substantially damaging the topmost second nanostructure 124a.

Figure 20:
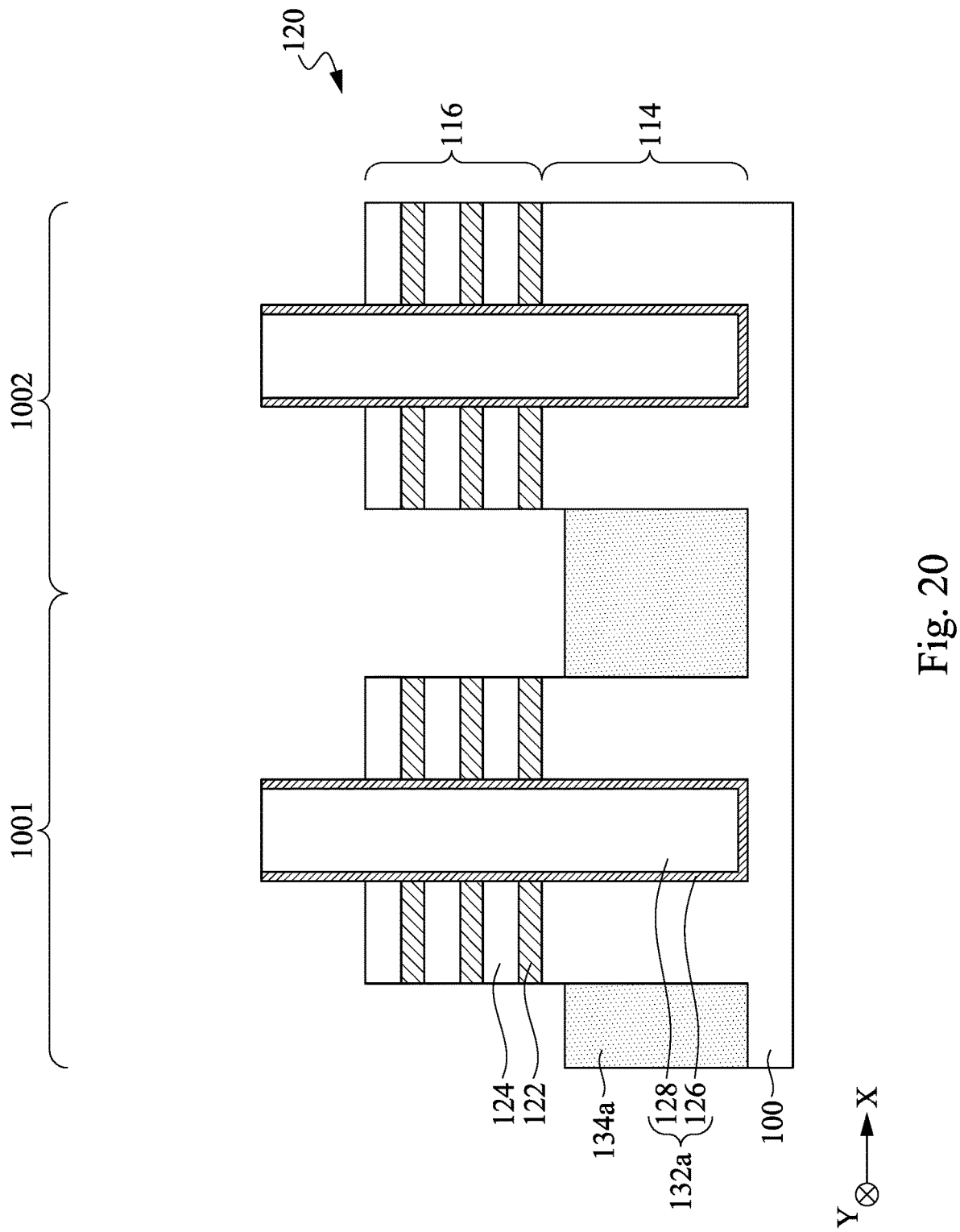

Referring to FIG. 20, a recessing process (e.g., etch back process) is performed to remove a portion of the insulation material 134, forming shallow trench isolation (STI) regions 134a.

Figure 21:
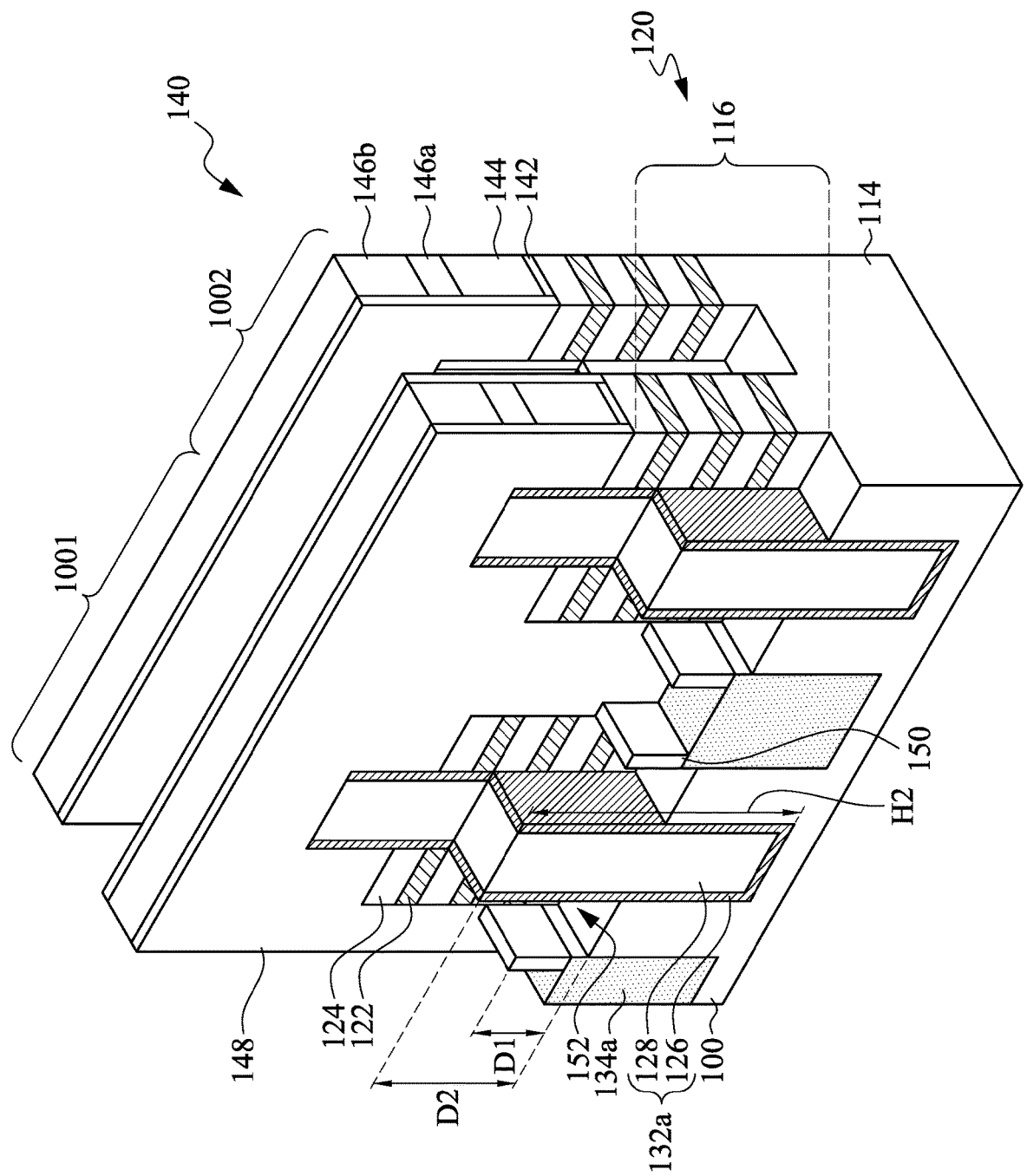
FIGS. 21, 22, 23, and 24A are perspective views of a method of manufacturing a semiconductor device at various stages in accordance with some embodiments.

Referring to FIG. 21, a gate structure 140 is formed over the fins 120. The gate structure 140 includes a dummy gate stack (represented by a dummy gate electrode 144 and in some implementations, a dummy gate dielectric 142), gate spacers 148, and a hard mask including multiple layers (e.g., a pad layer 146a and a mask layer 146b). Gate spacers 148 are formed adjacent to the dummy gate stack of the gate structure 140. Fin spacers 150 are formed on tops of the STI regions 134a. Source/drain recesses 152 are formed in the nanostructures 116 and the substrate 100, in accordance with some embodiments. Formation of the gate structure 140, the gate spacers 148, the fin spacers 150 and the source/drain recesses 152 is discussed previously with respect to FIG. 9, and the detailed description thereof is thus not repeated for the sake of brevity.

A recessing process (e.g., etch back process) is performed to remove a portion of the dielectric fin 132 so that the dielectric fin 132 has a reduced height H3. A vertical distance D1 between a top surface of the fin spacers 150 and a top surface of the recessed fin structure 114 is different from a vertical distance D2 between a top surface of the recessed dielectric fin 132a and the top surface of the recessed fin structure 114. For example, the vertical distance D2 is greater than the vertical distance D1. In other words, the top surface of the dielectric fin 132 is higher than the top surface of the fin spacer 150. By using such configuration, a subsequent epitaxial source/drain region can have an asymmetric shape.

Figure 22:
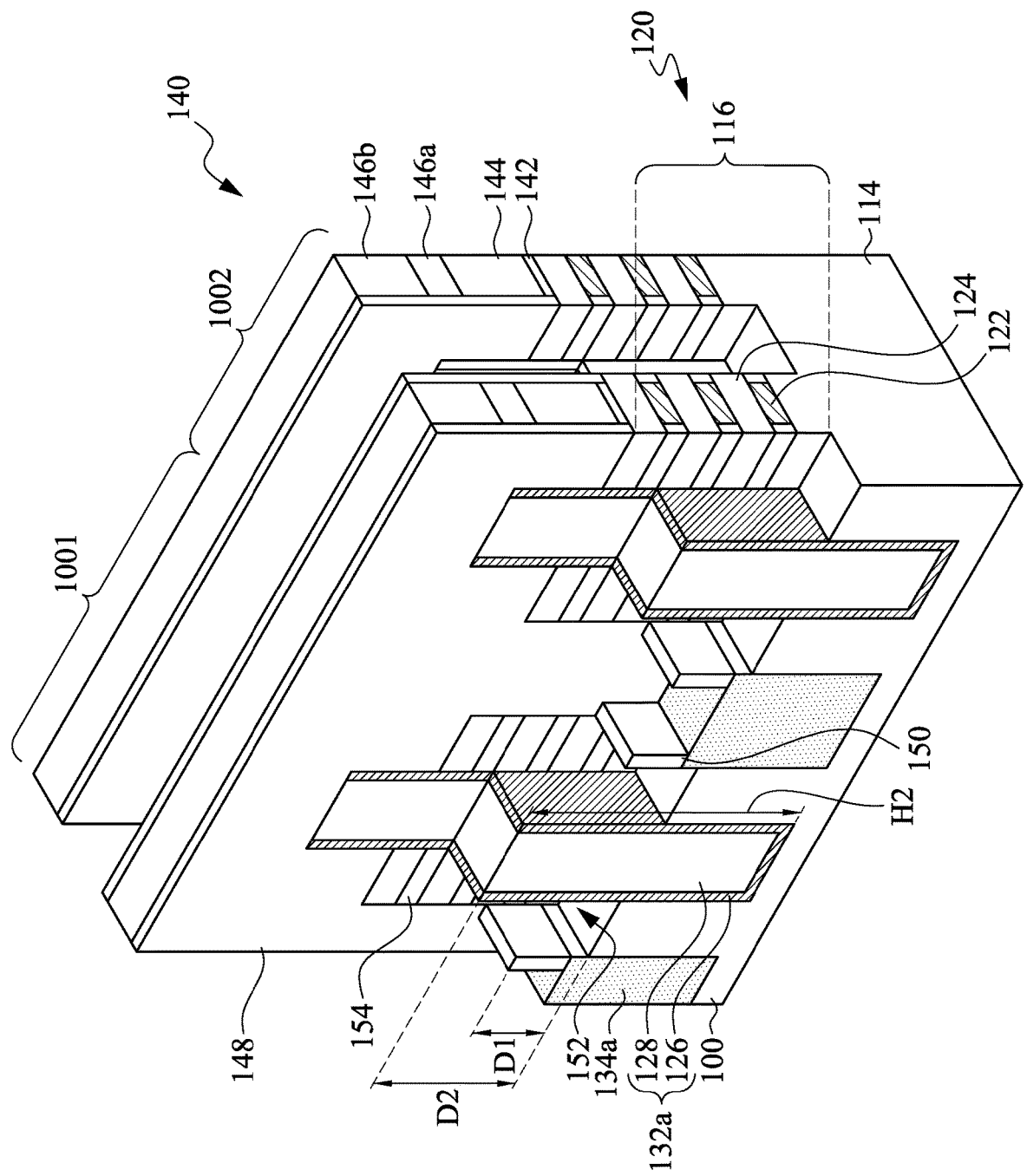

Portions of sidewalls of the layers of the nanostructures 116 formed of the first semiconductor materials (e.g., the first nanostructures 122) exposed by the source/drain recesses 152 are etched, and then inner spacers 154 are formed in the sidewall recess, as shown in FIG. 22. Formation of the inner spacers 154 is discussed previously with respect to FIG. 10, and the detailed description thereof is thus not repeated for the sake of brevity.

Figure 23:
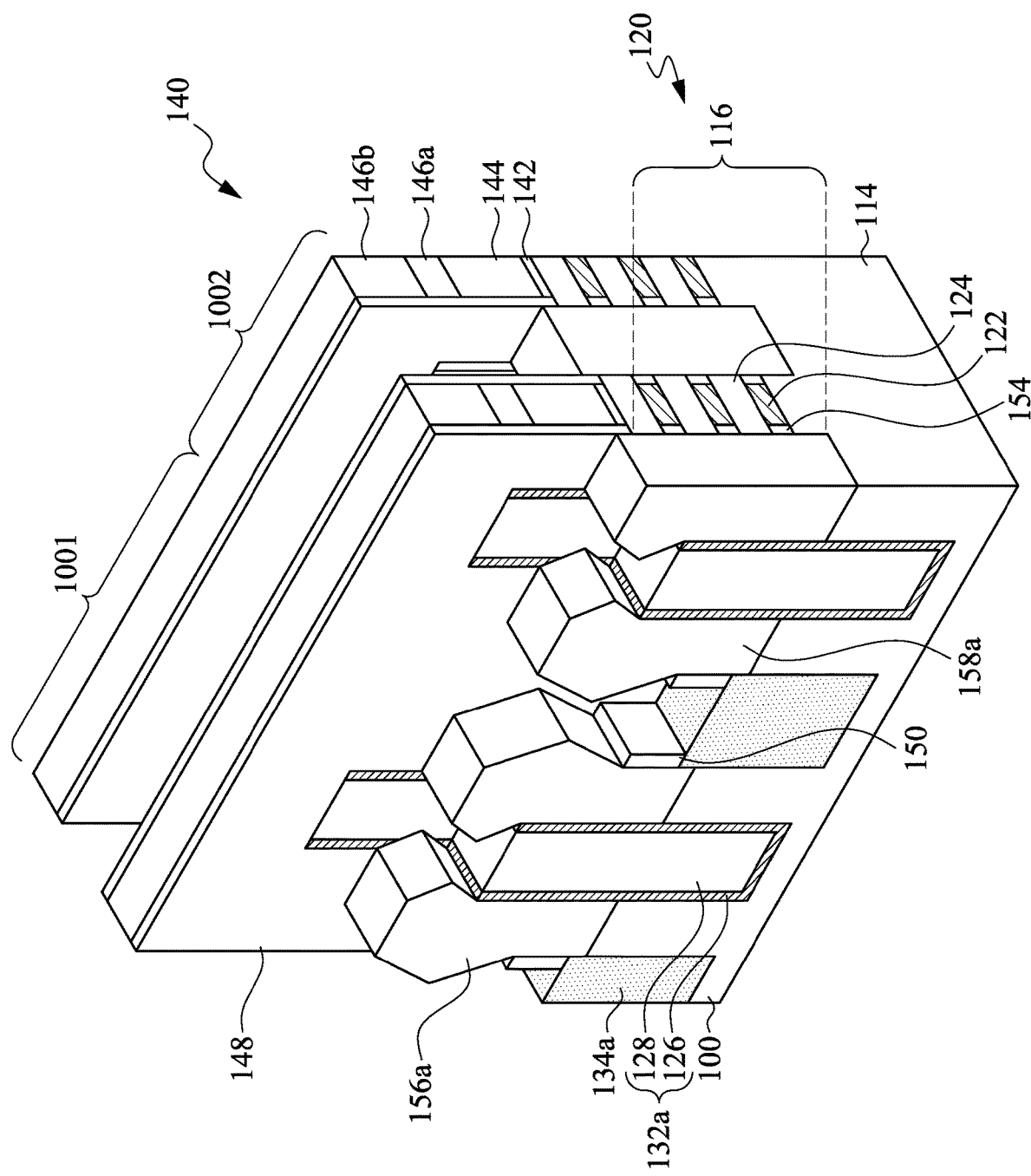

Epitaxial source/drain regions 156a and 158a are formed in the source/drain recesses 152, as shown in FIG. 23. Formation of the epitaxial source/drain regions 156a and 158a is discussed previously with respect to FIG. 11, and the detailed description thereof is thus not repeated for the sake of brevity.

Figure 24A:
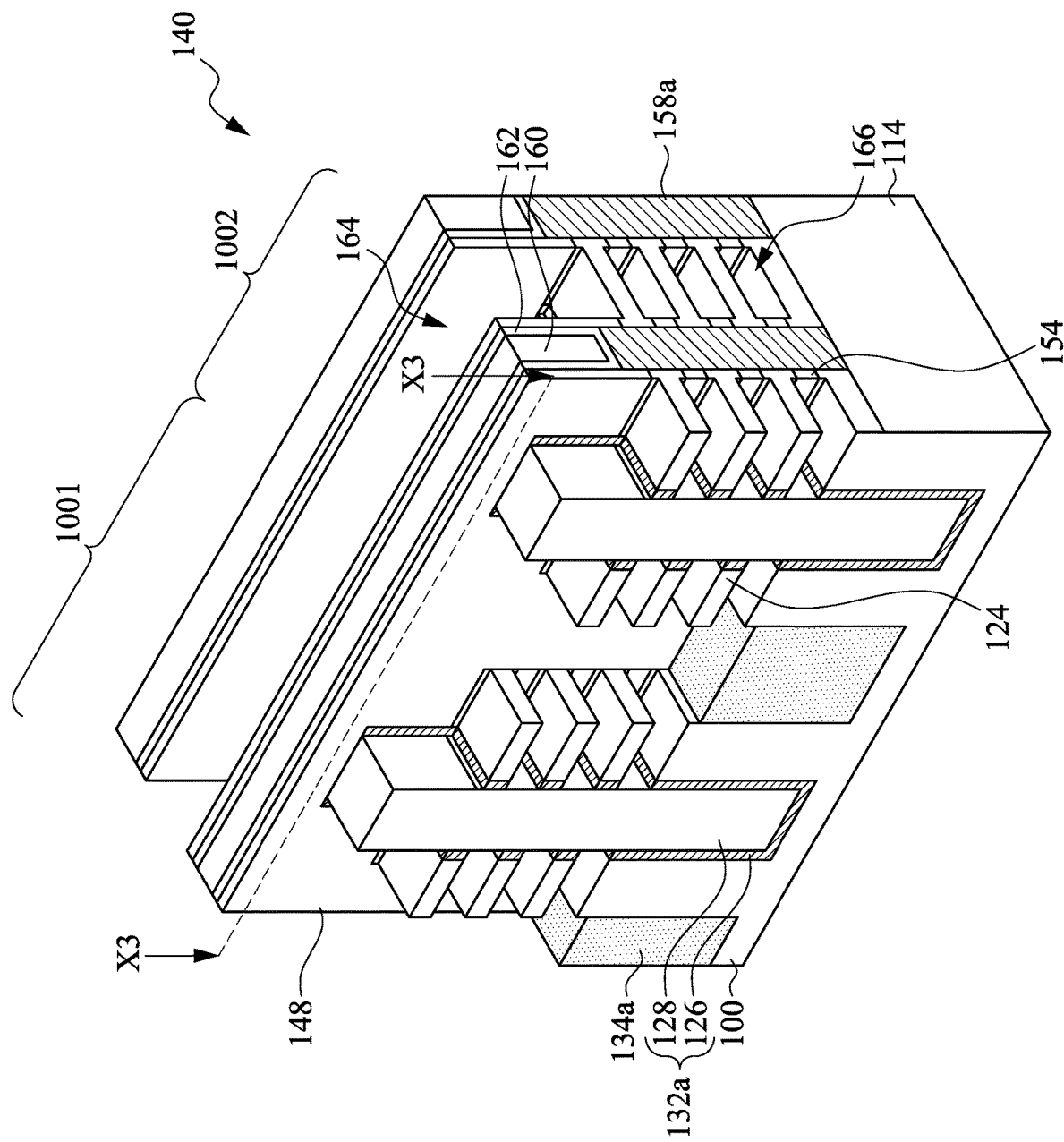
Figure 24B:
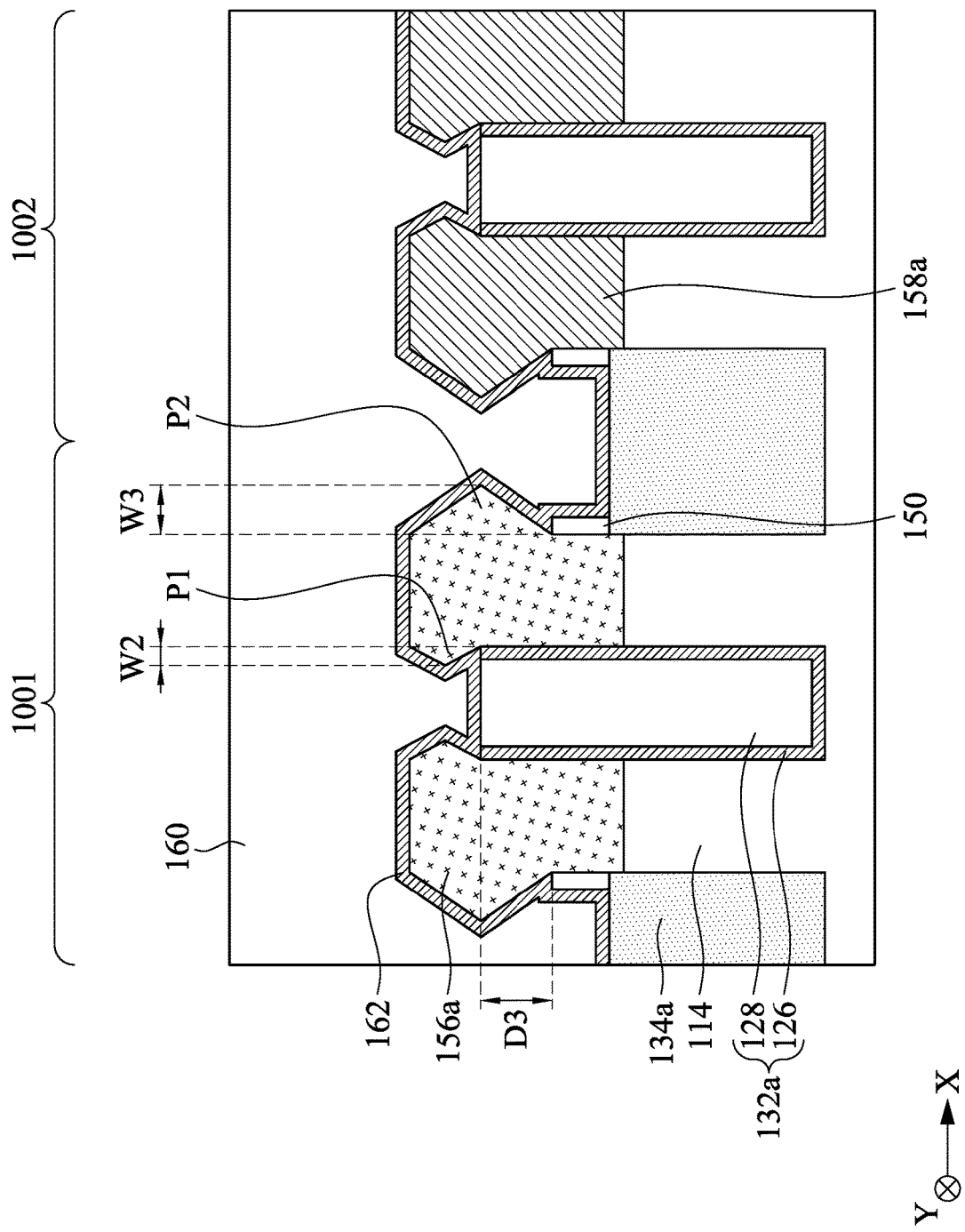
FIG. 24B is a cross-sectional view corresponding to line X3-X3 of FIG. 24A according to some embodiments of the present disclosure.
Figure 25A:
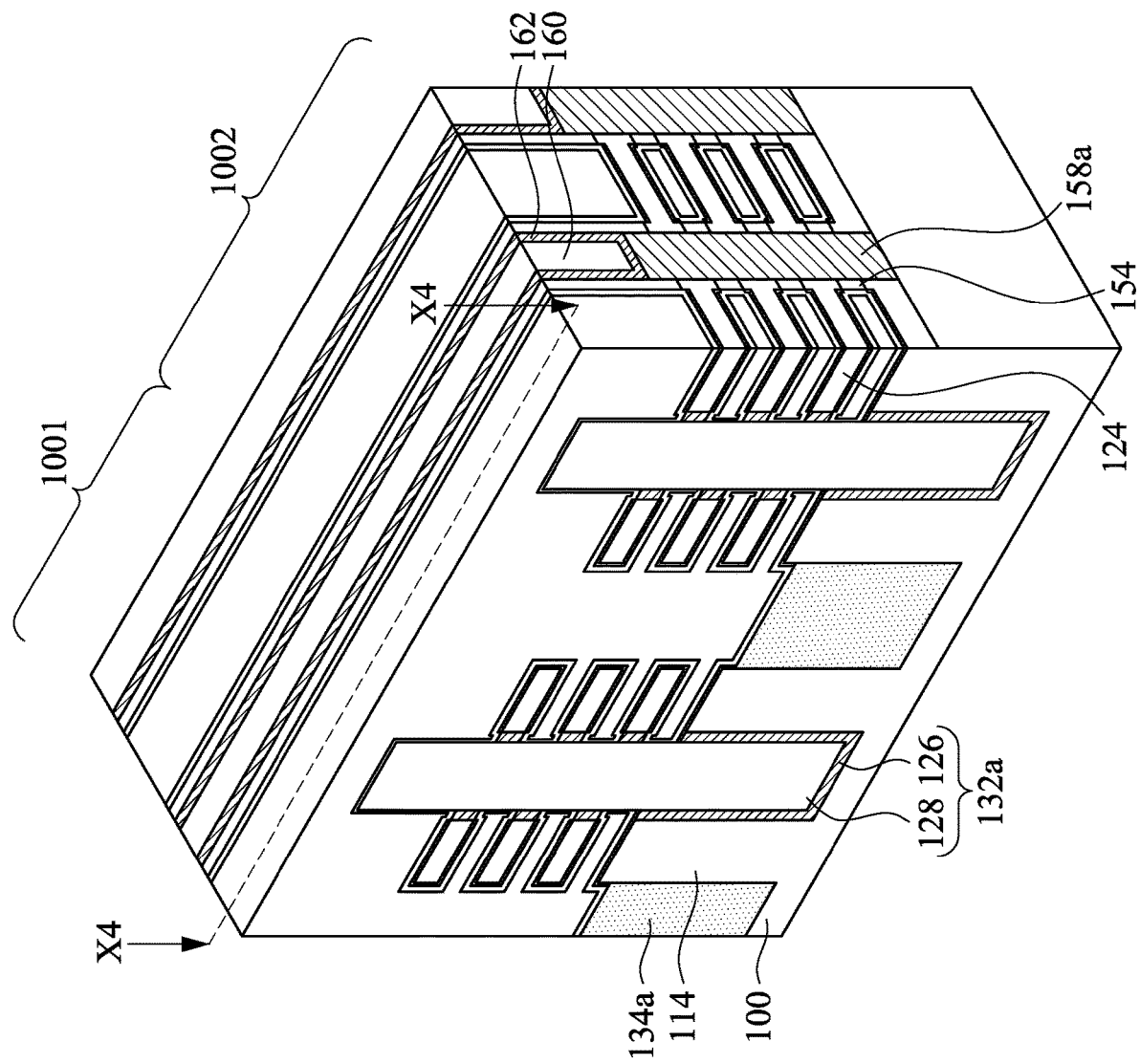
FIG. 25A is a perspective view of a method of manufacturing a semiconductor device at various stages in accordance with some embodiments.

In FIGS. 24A and 24B, a contact etch stop layer (CESL) 162 and an interlayer dielectric (ILD) layer 160 are deposited over the structure illustrated in FIG. 23. The dummy gate stacks (i.e., the dummy gate electrode layer 144 and the dummy gate dielectric 142) are removed in one or more etching steps, so that gate trenches 164 are formed between corresponding gate spacers 148. The first nanostructures 122 in the gate trenches 164 are then removed, and gaps 166 (empty spaces) are formed between the second nanostructures 124. Formation of the CESL 162 and the ILD layer 160 is discussed previously with respect to FIG. 12, and the detailed description thereof is thus not repeated for the sake of brevity.

As mentioned above, the top surface of the dielectric fin 132 is higher than the top surfaces of the fin spacers 150, and therefore the epitaxial growth of the source/drain regions result in an asymmetric shape structure. For example, a vertical distance D3 between the top surface of the dielectric fin 132 and the top surface of the fin spacers 150 is in a range from 5 nm to 20 nm. The epitaxial source/drain region 156a has a first lateral portion P1 over the dielectric fin 132a and a second lateral portion P2 over the fin spacer 150. The first lateral portion P1 has a width W2 different from a width W3 of the second lateral portion P2. The width W2 is smaller than the width W3. For example, the first lateral portion P1 and the second lateral portion P2 have a width difference in a range from 1 nm to 12 nm. Because the epitaxial source/drain regions 156a each has the first lateral portion P1 with the width W2 small enough facing each other, the first lateral portions P1 would not be in contact with each other, preventing bridging of the epitaxial source/drain regions 156a.

Similarly, the epitaxial source/drain regions 158a have asymmetric shape similar to the epitaxial source/drain regions 156a, and thus the bridging of the epitaxial source/drain regions 158a can be prevented.

Next, in FIGS. 25A-25B, high-k/metal gate structures are formed. As shown in cross-sectional view of FIG. 25B, the dielectric fin 132 and corresponding neighboring second nanostructures 124 collectively have a fishbone shape or a fork-sheet shape. In some cases, the first dielectric film 126 may be trimmed to have a reduced vertical thickness before forming the high-k/metal gate structure. The top surface of the dielectric fin is higher than the top surface of the topmost second nanostructure 124a. For example, the top surface of the dielectric fin 132a and the top surface of the topmost second nanostructure 124a have a vertical distance S6 in a range from 10 nm to 30 nm.

FIG. 25C is an enlarged view of a region R1 in FIG. 25B, in some embodiments, the second nanostructure 124 and the second dielectric film 128 have a lateral distance S5 controlled to within in a range from 3 nm to 5 nm. That is, the first dielectric film 126 has a lateral width in a range from 3 nm to 5 nm. A top surface of the second nanostructure 124 and a top surface of the first dielectric film 126 has a vertical distance S4 controlled to within in a range from 0 nm to 2 nm. If the lateral distance S5 and the vertical distance S4 are out of the corresponding range, the short channel effect (SCE) is difficult to be controlled and costly alternating current (AC) performance penalties cannot be avoided.

Formation of the metal gate structures 168 including the interfacial layer 170, the gate electrodes 174 and the gate dielectric layer 172 is discussed previously with respect to FIGS. 13A-13C, and the detailed description thereof is thus not repeated for the sake of brevity.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by the GAA transistor including fork-sheet structure, a lateral sheet-to-sheet distance can be reduced, and gate-to-drain capacitance can be improved by reducing endcap portions of metal gate. Another advantage is that by forming a dielectric cap within a top gap of the seam and reducing a height of the dielectric fin, shorting between source/drain contact and the metal gate prevented. Yet another advantage is that by increasing a height of the dielectric fin, bridging risk between source/drain epitaxial structures can be prevented.

In some embodiments, a method of forming a semiconductor device includes etching trenches in a substrate to form semiconductor fins, filling a first one of the trenches with a dielectric fin, forming an insulation material in a second one of the trenches, performing a first recessing process to recess the insulation material and form a gap on a top of the dielectric fin, filling the gap with a dielectric cap, and forming a gate stack across the semiconductor fins and the dielectric fin. In some embodiments, the method further includes after filling the gap with the dielectric cap, performing a second recessing process to recess the insulation material. In some embodiments, the method further includes recessing the dielectric fin after performing the second recessing process. In some embodiments, the dielectric cap includes SiN, SiCN, SiOC, SiOCN, or a combination thereof. In some embodiments, filling the first one of the trenches with the dielectric fin comprises forming a first dielectric film lining the first one of the trenches and forming a second dielectric film on the first dielectric film such that the second dielectric film has a seam inside the second dielectric film. In some embodiments, each of the semiconductor fins comprises first nanostructures and second nanostructures alternating stacked, the first nanostructures and the second nanostructures have etch selectivity, the method further comprises removing the first nanostructures before forming the gate stack and trimming a portion of the dielectric fin. In some embodiments, after trimming the portion of the dielectric fin, the first dielectric film has a thickness less than a thickness of the second nanostructures. In some embodiments, after trimming the portion of the dielectric fin, the first dielectric film has a lateral width in a range from 3 nm to 5 nm. In some embodiments, after trimming the portion of the dielectric fin, a vertical distance between a top surface of the first dielectric film and a top surface of the second nanostructures is in a range from 0 nm to 2 nm. In some embodiments, the method further includes forming epitaxial source/drain regions on opposite sides of the dielectric fin, and forming an interlayer dielectric (ILD) layer on the dielectric fin, wherein the epitaxial source/drain regions are separated by the ILD layer. In some embodiments, the ILD layer has a top width smaller than a bottom width.

In some embodiments, a method of forming a semiconductor device includes forming fins protruding from a substrate, wherein the fins each has alternating stacked first nanostructures and second nanostructures, the first nanostructures have a bottommost one and a topmost one thicker than the bottommost one, forming a dielectric fin on a first side of one of the fins, forming an insulation material on a second side of the one of the fins opposite to the first side, removing the topmost one of the first nanostructures, forming recesses in the fins, and growing epitaxial source/drain regions from the recesses in the fins, respectively. In some embodiments, the method further includes recessing the insulation material after removing the topmost one the first nanostructures. In some embodiments, the epitaxial source/drain regions have an asymmetric shape. In some embodiments, the method further includes forming fin spacers on the insulation material, wherein the fin spacers have a top surface lower than a top surface of the dielectric fin. In some embodiments, the epitaxial source/drain regions have a first lateral portion over the dielectric fin and a second lateral portion over the fin spacers, the first lateral portion has a width different from a width of the second lateral portion. In some embodiments, a vertical distance between the top surface of the dielectric fin and the top surface of the fin spacers is in a range from 5 nm to 20 nm.

In some embodiments, a semiconductor device includes a plurality of semiconductor fins protruding from a substrate, a dielectric fin between two neighboring semiconductor fins, epitaxial source/drain regions on opposite sides of the dielectric fin, wherein the epitaxial source/drain regions each have asymmetric shape, and a gate stack extending across the semiconductor fins and the dielectric fin. In some embodiments, the semiconductor device further comprises a fin spacer on a side of the epitaxial source/drain regions, the fin spacer has a top surface lower than a top surface of the dielectric fin. In some embodiments, the epitaxial source/drain regions each has a first lateral portion over the dielectric fin and a second lateral portion over the fin spacer, and the first lateral portion and the second lateral portion have a width difference in a range from 1 nm to 12 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   etching trenches in a substrate to form semiconductor fins;
   filling a first one of the trenches with a dielectric fin;
   forming an insulation material in a second one of the trenches;
   performing a first recessing process to recess the insulation material and form a gap on a top of the dielectric fin;
   filling the gap with a dielectric cap; and
   forming a gate stack across the semiconductor fins and the dielectric fin.

2. The method of claim 1, further comprising:
   after filling the gap with the dielectric cap, performing a second recessing process to recess the insulation material.

3. The method of claim 2, further comprising:
   recessing the dielectric fin after performing the second recessing process.

4. The method of claim 1, wherein the dielectric cap includes SiN, SiCN, SiOC, SiOCN, or a combination thereof.

5. The method of claim 1, wherein filling the first one of the trenches with the dielectric fin comprises:
   forming a first dielectric film lining the first one of the trenches; and
   forming a second dielectric film on the first dielectric film such that the second dielectric film has a seam inside the second dielectric film.

6. The method of claim 5, wherein each of the semiconductor fins comprises first nanostructures and second nanostructures alternating stacked, the first nanostructures and the second nanostructures have etch selectivity, the method further comprises:
   removing the first nanostructures before forming the gate stack; and
   trimming a portion of the dielectric fin.

7. The method of claim 6, wherein after trimming the portion of the dielectric fin, the first dielectric film has a thickness less than a thickness of the second nanostructures.

8. The method of claim 6, wherein after trimming the portion of the dielectric fin, the first dielectric film has a lateral width in a range from 3 nm to 5 nm.

9. The method of claim 6, wherein after trimming the portion of the dielectric fin, a vertical distance between a top surface of the first dielectric film and a top surface of the second nanostructures is in a range from 0 nm to 2 nm.

10. The method of claim 6, further comprising:
    forming epitaxial source/drain regions on opposite sides of the dielectric fin; and
    forming an interlayer dielectric (ILD) layer on the dielectric fin, wherein the epitaxial source/drain regions are separated by the ILD layer.

11. The method of claim 10, wherein the ILD layer has a top width smaller than a bottom width.

12. A method of forming a semiconductor device, comprising:
    forming fins protruding from a substrate, wherein the fins each has alternating stacked first nanostructures and second nanostructures, the first nanostructures have a bottommost one and a topmost one thicker than the bottommost one;
    forming a dielectric fin on a first side of one of the fins;
    forming an insulation material on a second side of the one of the fins opposite to the first side;
    removing the topmost one of the first nanostructures;
    forming recesses in the fins; and
    growing epitaxial source/drain regions from the recesses in the fins, respectively.

13. The method of claim 12, further comprising:
    recessing the insulation material after removing the topmost one the first nanostructures.

14. The method of claim 12, wherein the epitaxial source/drain regions have an asymmetric shape.

15. The method of claim 12, further comprising:
    forming fin spacers on the insulation material, wherein the fin spacers have a top surface lower than a top surface of the dielectric fin.

16. The method of claim 15, wherein the epitaxial source/drain regions have a first lateral portion over the dielectric fin and a second lateral portion over the fin spacers, the first lateral portion has a width different from a width of the second lateral portion.

17. The method of claim 15, wherein a vertical distance between the top surface of the dielectric fin and the top surface of the fin spacers is in a range from 5 nm to 20 nm.

18. A semiconductor device, comprising:
- a plurality of semiconductor fins protruding from a substrate;
- a dielectric fin between two neighboring semiconductor fins;
- epitaxial source/drain regions on opposite sides of the dielectric fin, wherein the epitaxial source/drain regions each have asymmetric shape;
- a gate stack extending across the semiconductor fins and the dielectric fin; and
- a fin spacer on a side of the epitaxial source/drain regions, the fin spacer has a top surface lower than a top surface of the dielectric fin.

19. The semiconductor device of claim 18, wherein the epitaxial source/drain regions each has a first lateral portion over the dielectric fin and a second lateral portion over the fin spacer, and the first lateral portion and the second lateral portion have a width difference in a range from 1 nm to 12 nm.

20. The semiconductor device of claim 18, wherein the top surface of the dielectric fin is higher than a top surface of one of the plurality of semiconductor fins.

* * * * *